(12) United States Patent
Handa et al.

(10) Patent No.: US 10,559,610 B2
(45) Date of Patent: Feb. 11, 2020

(54) IMAGING DEVICE AND METHOD OF MANUFACTURING IMAGING DEVICE

(71) Applicant: CANON KABUSHIKI KAISHA, Tokyo (JP)

(72) Inventors: Yoichiro Handa, Tokyo (JP); Ginjiro Toyoguchi, Tokyo (JP); Junji Iwata, Tokyo (JP); Yoichi Wada, Yokohama (JP); Hideyuki Ito, Kawasaki (JP); Hiromasa Tsuboi, Tama (JP); Daichi Seto, Yokohama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 16/052,865

(22) Filed: Aug. 2, 2018

(65) Prior Publication Data

US 2019/0051685 A1 Feb. 14, 2019

(30) Foreign Application Priority Data

Aug. 9, 2017 (JP) .................................. 2017-153929

(51) Int. Cl.
*H01L 27/146* (2006.01)
*H04N 5/378* (2011.01)

(52) U.S. Cl.
CPC .... *H01L 27/14605* (2013.01); *H01L 27/1463* (2013.01); *H01L 27/14612* (2013.01);
(Continued)

(58) Field of Classification Search
CPC ............... H01L 21/0415; H01L 21/046; H01L 27/14607
See application file for complete search history.

(56) References Cited

U.S. PATENT DOCUMENTS 6,114,740 A * 9/2000 Takimoto .......... H01L 31/02024
257/461
7,911,521 B2 3/2011 Kuroda et al.
(Continued)

FOREIGN PATENT DOCUMENTS

JP 2006-303328 A 11/2006
JP 2017-033996 A 2/2017

OTHER PUBLICATIONS

JP 2006-303328, 2006/0240631 A1.
JP 2017-033996, U.S. Pat. No. 9,640,570 B2 U.S. Pat. No. 10,032,815 B2.

*Primary Examiner* — Jae Lee
(74) *Attorney, Agent, or Firm* — Venable LLP

(57) ABSTRACT

A method of manufacturing an imaging device, including a first buried diode including a first semiconductor region and a second semiconductor region and a second buried diode including a third semiconductor region and a fourth semiconductor region, includes implanting first impurity ions of a first conductivity type into a first region and a third region between the first region and a second region, and implanting second impurity ions of the first conductivity type into the second region and the third region, wherein the first semiconductor region is formed by implanting the first impurity ions, the third semiconductor region is formed by implanting the second impurity ions, and a fifth semiconductor region having a higher impurity concentration than the first and the second semiconductor regions is formed in the third region by implanting the first and second impurity ions.

10 Claims, 16 Drawing Sheets

(52) U.S. Cl.
CPC .. *H01L 27/14636* (2013.01); *H01L 27/14641* (2013.01); *H01L 27/14643* (2013.01); *H01L 27/14689* (2013.01); *H01L 27/14698* (2013.01); *H04N 5/378* (2013.01)

(56) References Cited

U.S. PATENT DOCUMENTS

| | | |
|---|---|---|
| 9,136,407 B2 | 9/2015 | Tsuchiya |
| 9,640,570 B2 | 5/2017 | Miki et al. |
| 10,032,815 B2 | 7/2018 | Miki et al. |
| 2005/0064613 A1* | 3/2005 | Takeuchi .......... H01L 27/14812 438/24 |
| 2005/0118743 A1* | 6/2005 | Maeng ................ H01L 27/1443 438/57 |
| 2006/0240631 A1 | 10/2006 | Kawasaki |
| 2008/0303930 A1 | 12/2008 | Kuroda et al. |
| 2014/0078337 A1 | 3/2014 | Tsuchiya |

\* cited by examiner

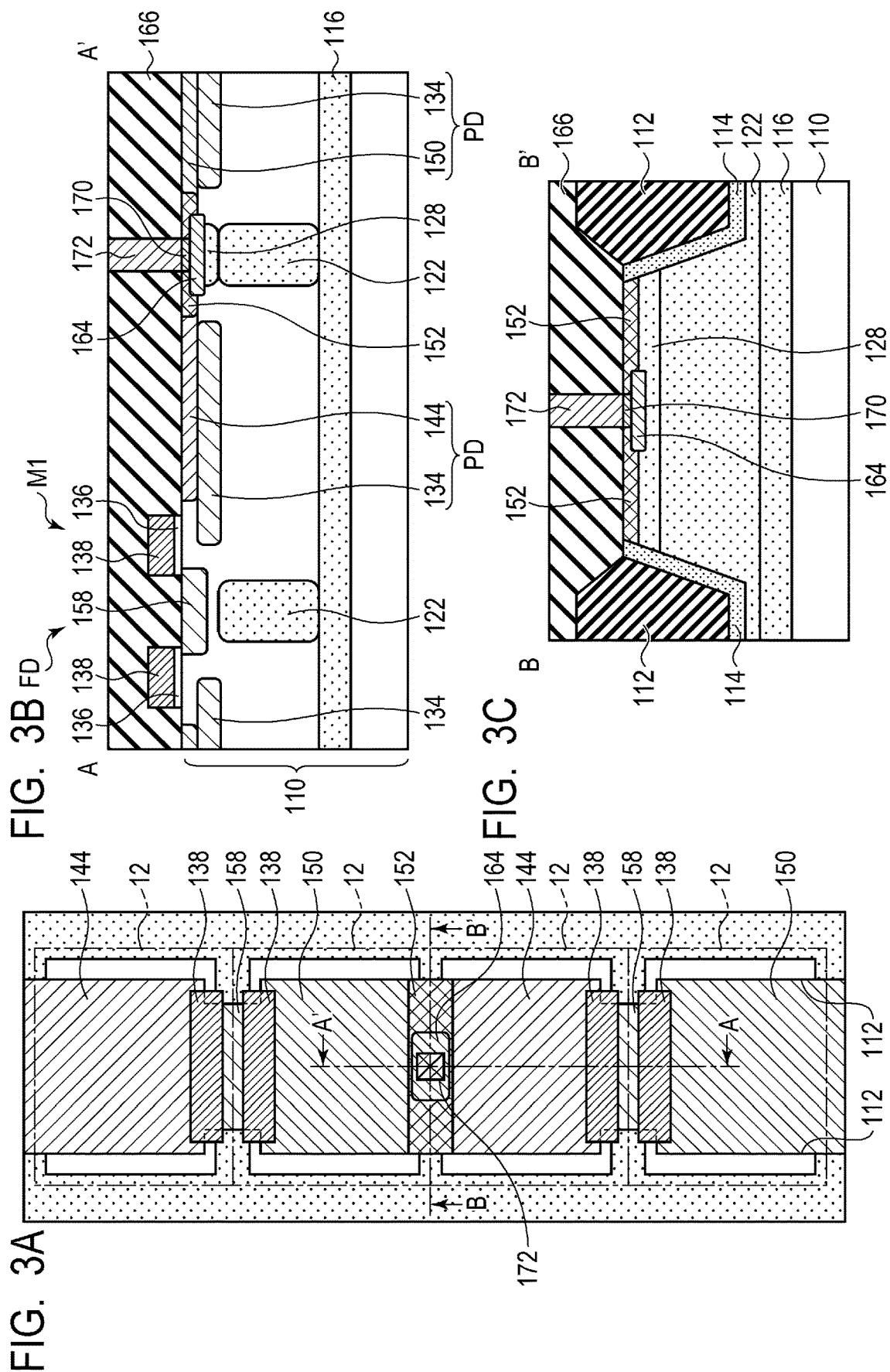

FIG. 4A
FIG. 4B
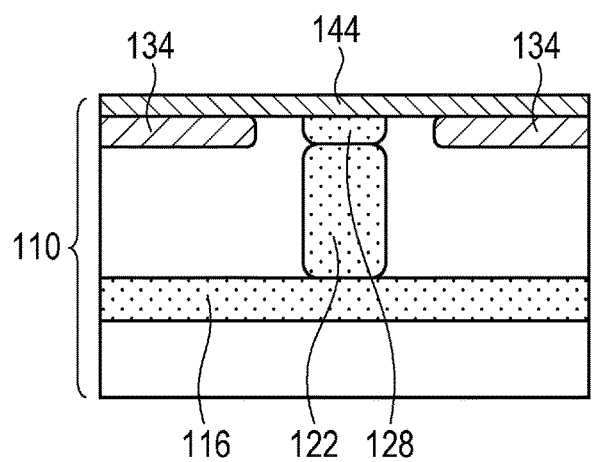
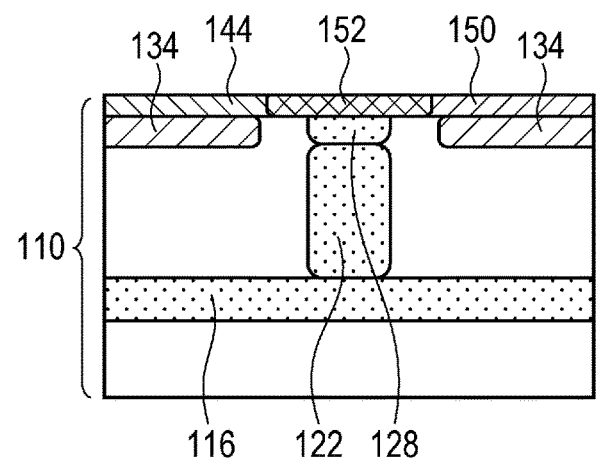
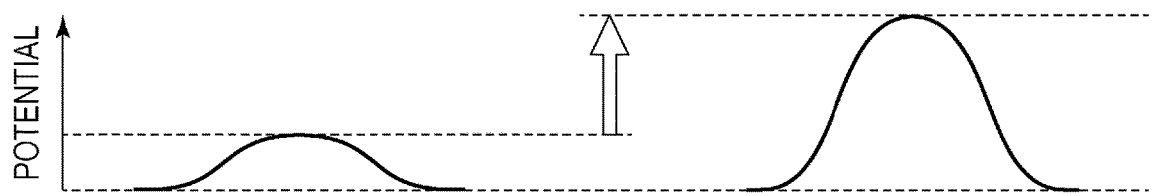

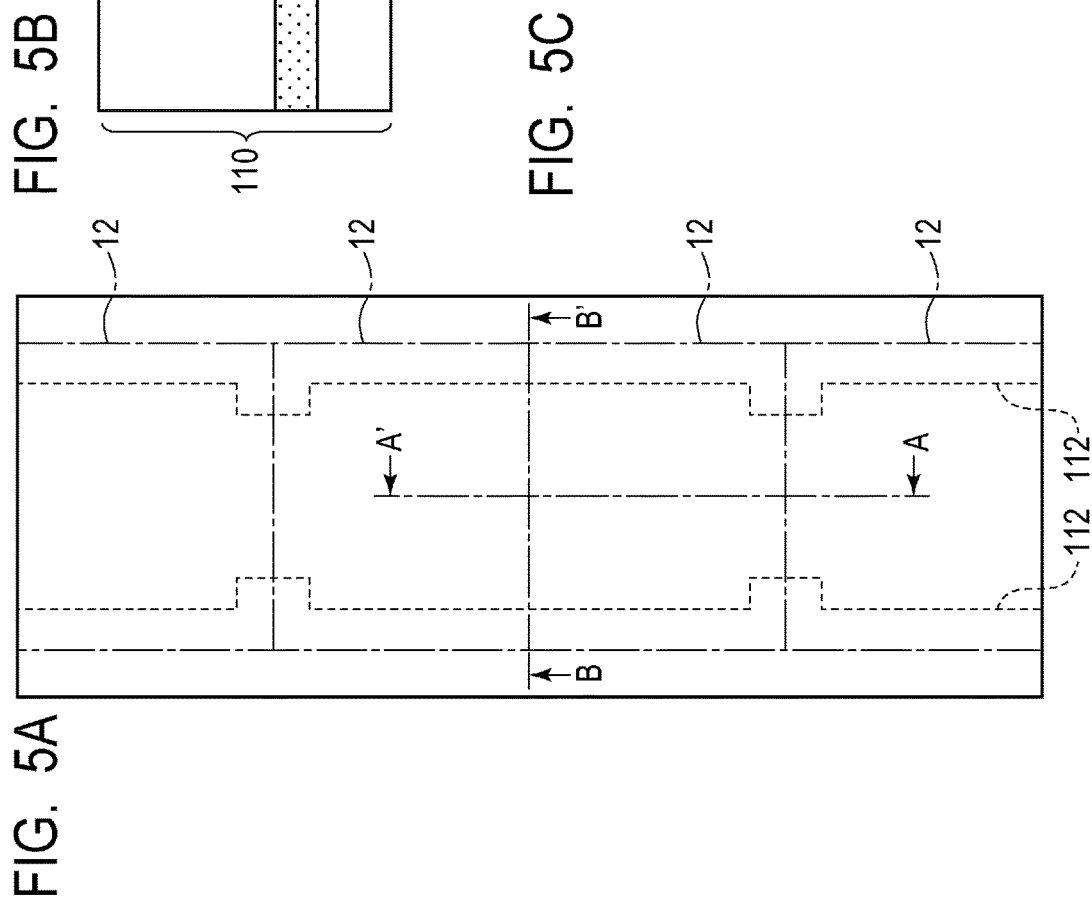

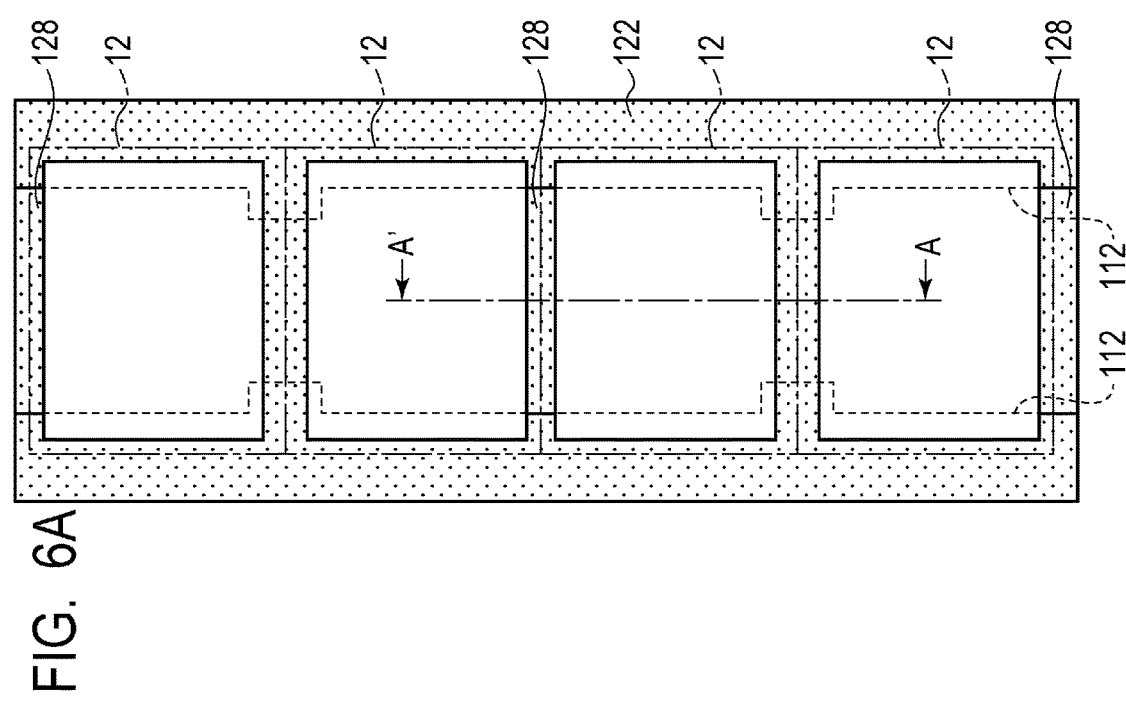

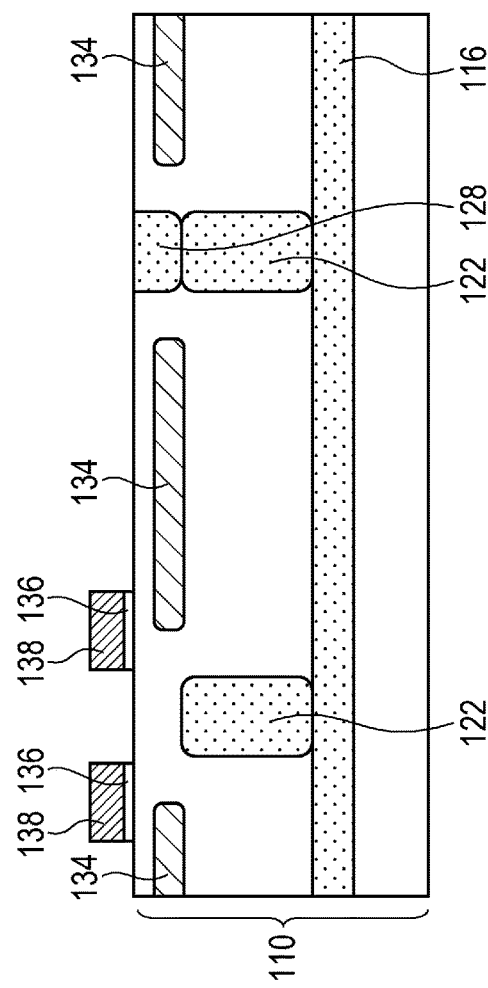
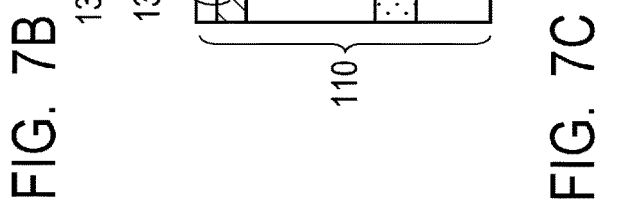
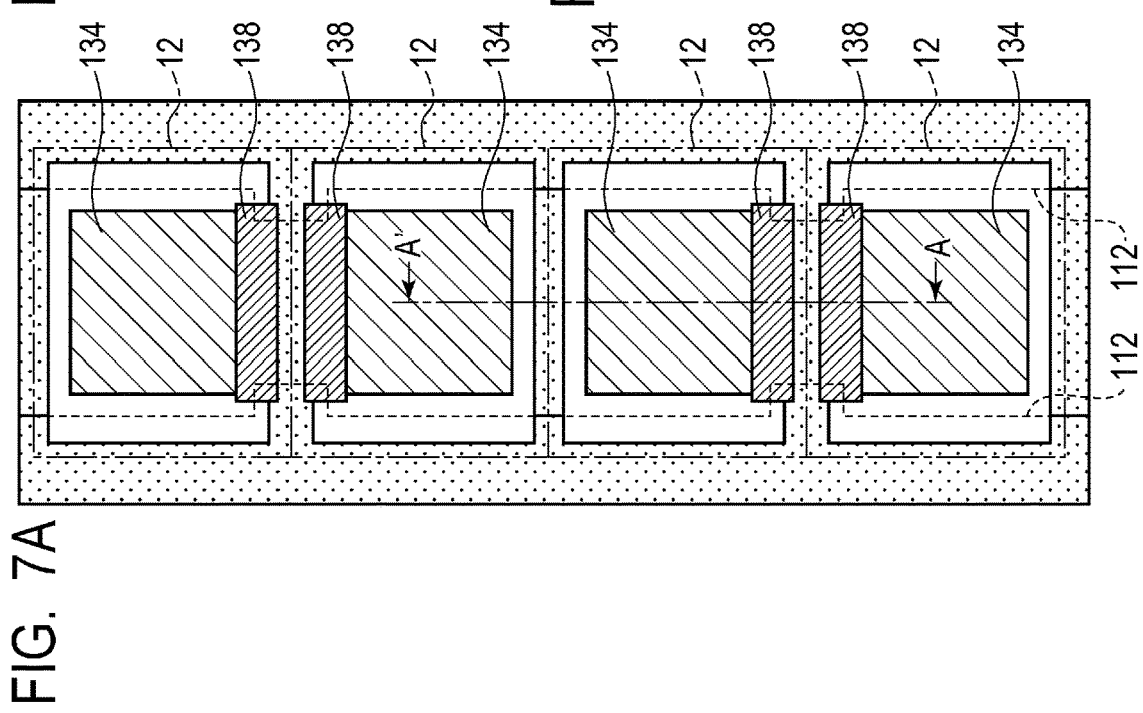

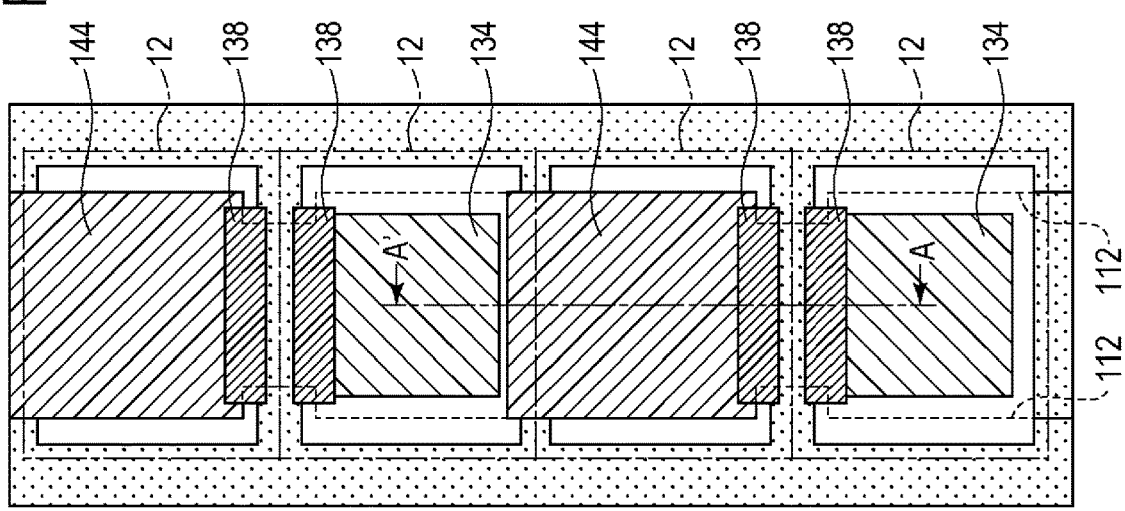

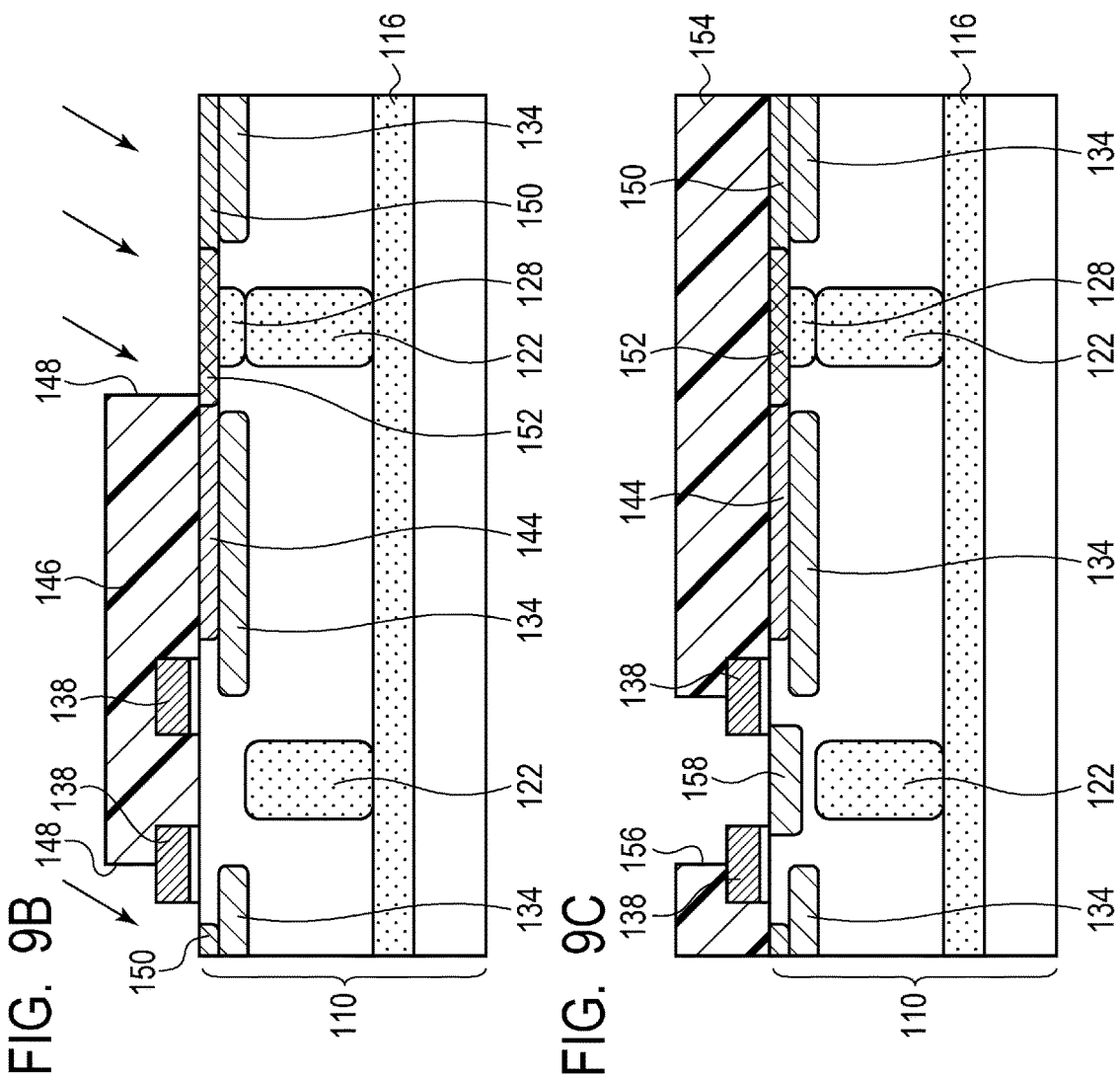
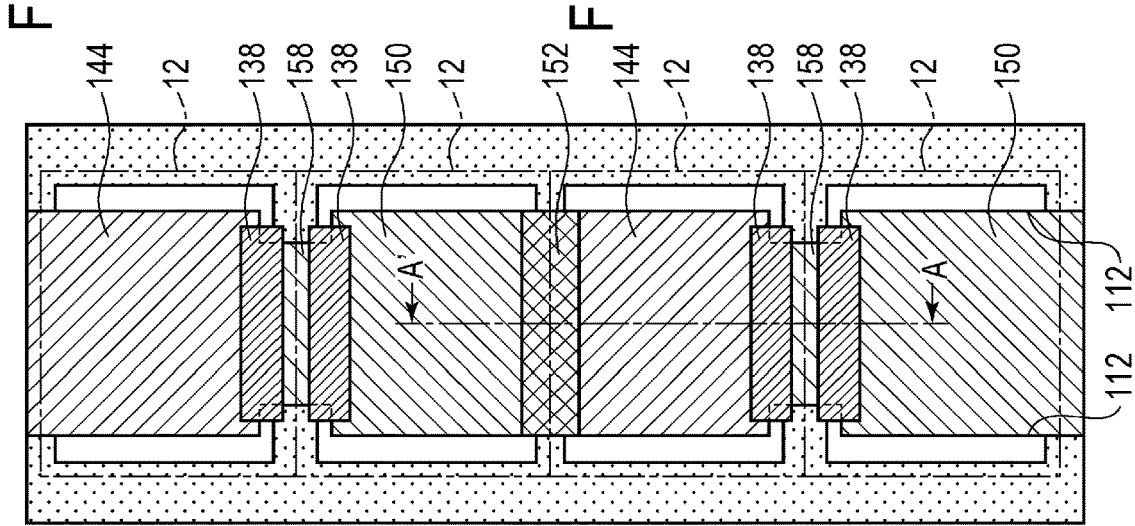

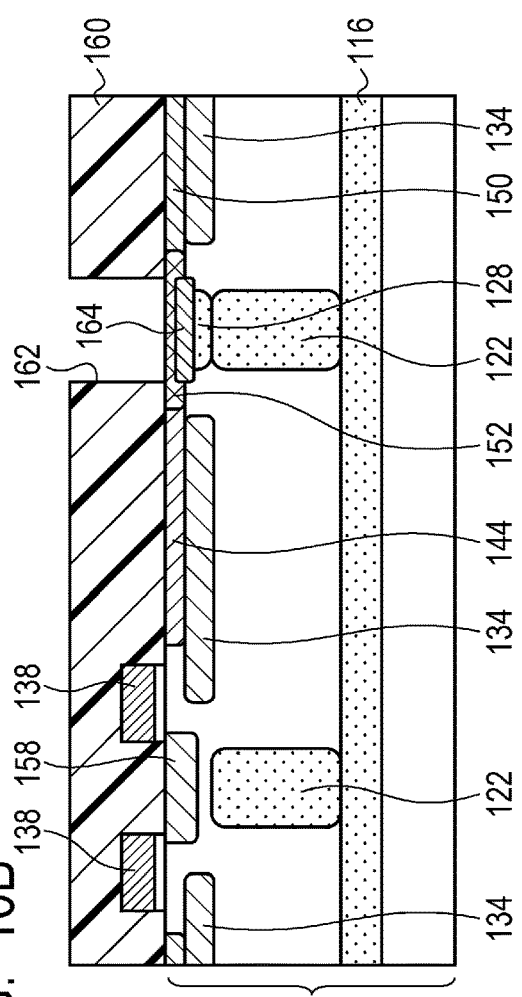
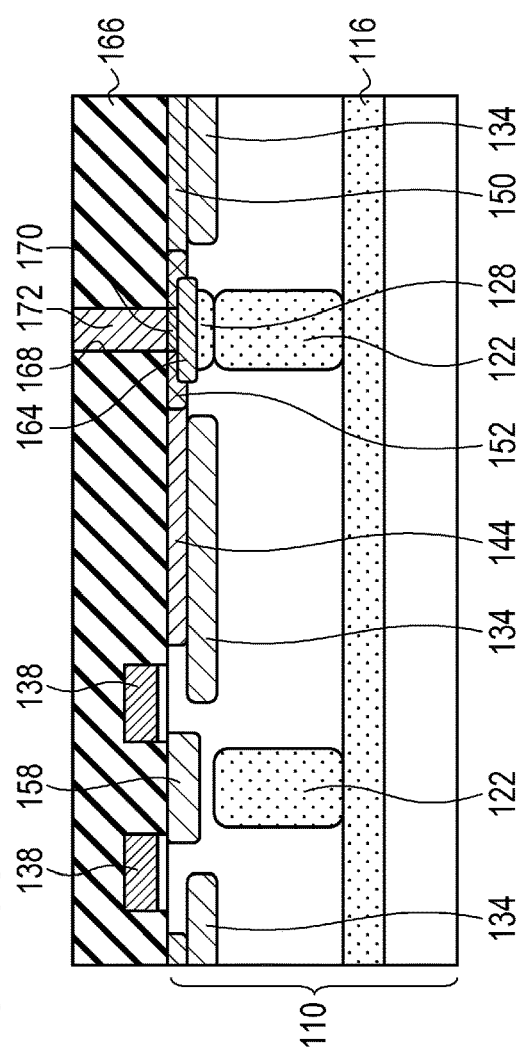
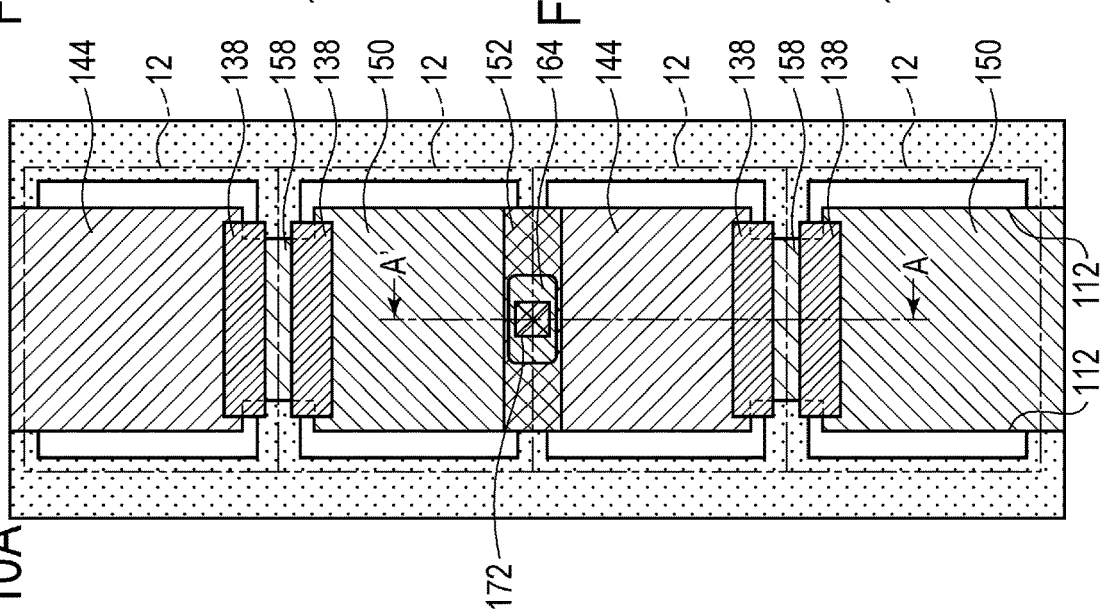

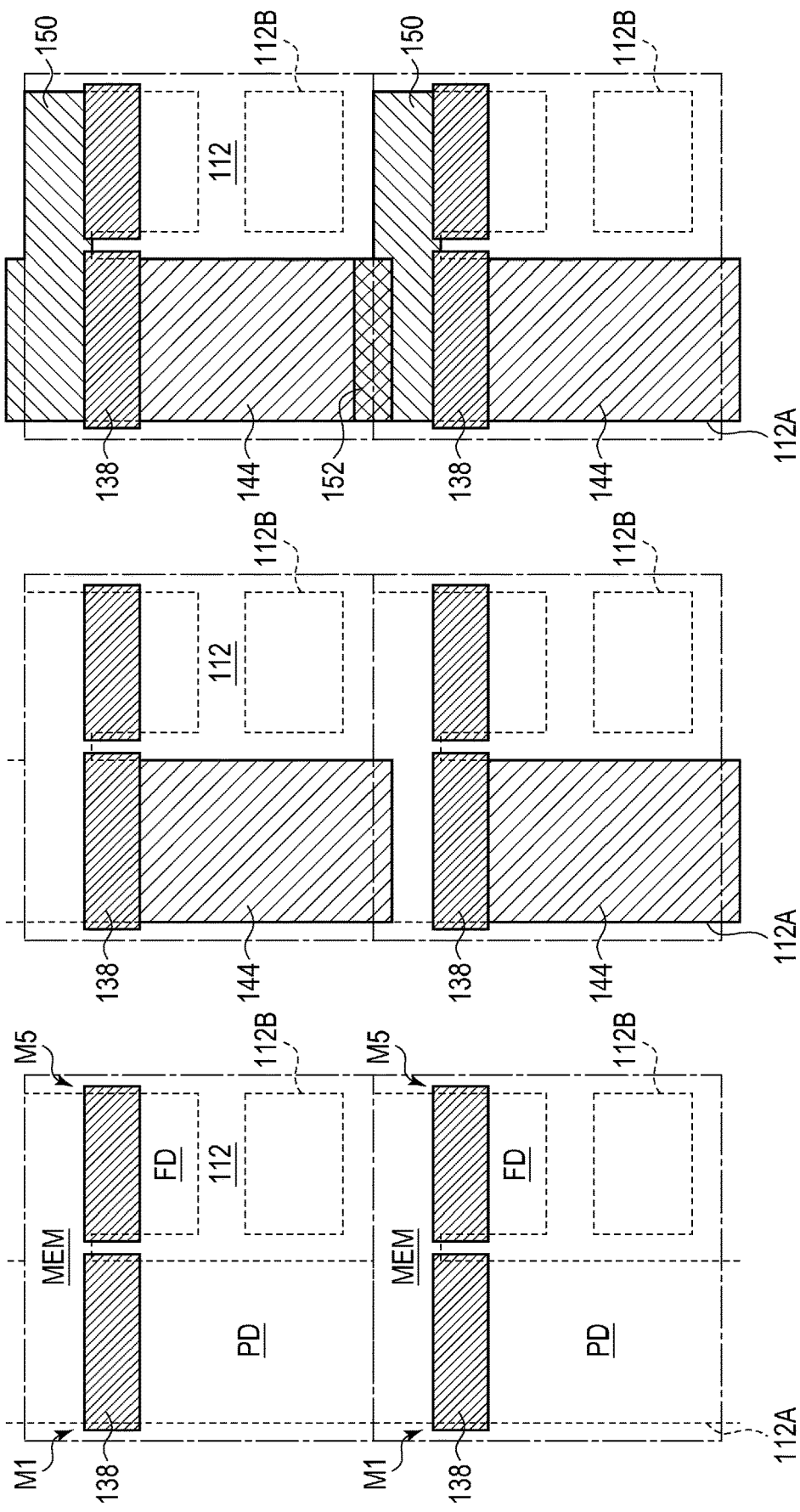

IMAGING DEVICE AND METHOD OF MANUFACTURING IMAGING DEVICE

BACKGROUND OF THE INVENTION

Field of the Invention

The present invention relates to an imaging device and a method of manufacturing the imaging device.

Description of the Related Art

As a technology for suppressing a white flaw defect in an imaging device, a use of so-called buried diode structure has been proposed in which a semiconductor region whose conductivity type is opposite to a charge accumulation region is arranged on the surface portion of a semiconductor region forming a charge accumulation region of a photoelectric conversion portion. Japanese Patent Application Laid-Open No. 2006-303328 discloses that semiconductor regions arranged on the surface part of the buried photodiode are formed by ion implantation from a different direction in accordance with a layout of a photoelectric conversion portion to have even pixel characteristics.

Further, in an imaging device having a global electronic shutter function, the buried diode structure may be employed for a charge holding portion that holds signal charges in a different place from a photoelectric conversion portion. Japanese Patent Application Laid-Open No. 2017-033996 discloses that a charge holding portion is formed by the same buried diode structure as that of a photodiode of a photoelectric conversion portion.

In terms of suppression of cross talk of signals between pixels, high integration of pixels, or the like, it is important to improve an isolation property between elements. In Japanese Patent Application Laid-Open No. 2006-303328 and Japanese Patent Application Laid-Open No. 2017-033996, however, there is no specific consideration or proposal for the isolation property among buried diodes forming a photoelectric conversion portion or a charge holding portion.

SUMMARY OF THE INVENTION

An object of the present invention is to provide an imaging device having a buried diode and is to provide an imaging device and a method of manufacturing the imaging device that can improve the isolation performance between neighboring buried diodes arranged without making a manufacturing process complex.

According to an aspect of the present invention, there is provided a method of manufacturing an imaging device including a first buried diode including a first semiconductor region of a first conductivity type provided in a surface part of a first region of a semiconductor substrate and a second semiconductor region of a second conductivity type provided inside the first region and a second buried diode including a third semiconductor region of the first conductivity type provided in a surface part of a second region of the semiconductor substrate and a fourth semiconductor region of the second conductivity type provided inside the second region, the method including implanting first impurity ions of the first conductivity type into the first region and a third region between the first region and the second region, and implanting second impurity ions of the first conductivity type into the second region and the third region, wherein the first semiconductor region is formed in the first region by the implanting the first impurity ions, the third semiconductor region is formed in the second region by the implanting the second impurity ions, and a fifth semiconductor region of the first conductivity type having a higher impurity concentration than the first semiconductor region and the second semiconductor region is formed in the third region by the implanting the first impurity ions and the implanting the second impurity ions.

According to another aspect of the present invention, there is provided an imaging device including a first buried diode including a first semiconductor region of a first conductivity type provided in a surface part of a first region of a semiconductor substrate and a second semiconductor region of a second conductivity type provided inside the first region, a second buried diode including a third semiconductor region of the first conductivity type provided in a surface part of a second region of the semiconductor substrate and a fourth semiconductor region of the second conductivity type provided inside the second region, a fifth semiconductor region of the first conductivity type provided at the same depth as the first semiconductor region and the third semiconductor region of a third region between the first region and the second region, and a sixth semiconductor region of the first conductivity type provided at a different depth from the fifth semiconductor region of the third region and electrically connected to a contact electrode provided on the semiconductor substrate, wherein an impurity concentration of the fifth semiconductor region is higher than an impurity concentration of the first semiconductor region and an impurity concentration of the third semiconductor region.

Further features of the present invention will become apparent from the following description of exemplary embodiments with reference to the attached drawings.

BRIEF DESCRIPTION OF THE DRAWINGS

FIG. 3A is a plan view illustrating the structure of the imaging device according to the first embodiment of the present invention.

FIG. 3B and FIG. 3C are cross-sectional views illustrating the structure of the imaging device according to the first embodiment of the present invention.

FIG. 4A and FIG. 4B are diagrams illustrating advantages of the imaging device according to the first embodiment of the present invention.

FIG. 5A, FIG. 6A, FIG. 7A, FIG. 8A, FIG. 9A, and FIG. 10A are plan views illustrating a method of manufacturing the imaging device according to the first embodiment of the present invention.

FIG. 5B, FIG. 5C, FIG. 6B, FIG. 6C, FIG. 7B, FIG. 7C, FIG. 8B, FIG. 9B, FIG. 9C, FIG. 10B, and FIG. 10C are cross-sectional views illustrating the method of manufacturing the imaging device according to the first embodiment of the present invention.

FIG. 12A, FIG. 12B, and FIG. 12C are plan views illustrating an imaging device and a method of manufacturing the same according to a third embodiment of the present invention.

DESCRIPTION OF THE EMBODIMENTS

Preferred embodiments of the present invention will now be described in detail in accordance with the accompanying drawings.

First Embodiment

Figure 1:
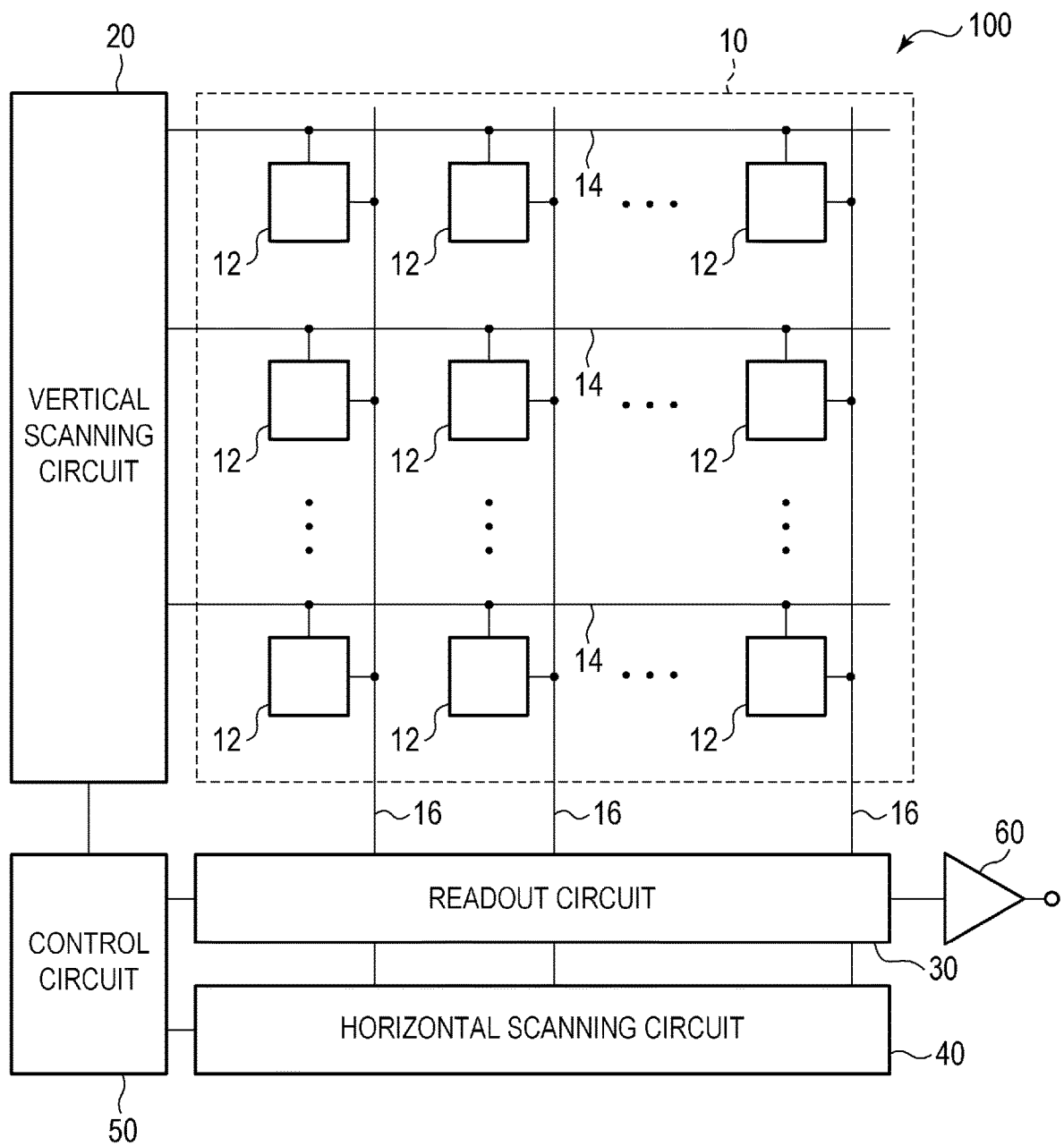
FIG. 1 is a block diagram illustrating a schematic configuration of an imaging device according to a first embodiment of the present invention.
Figure 2:
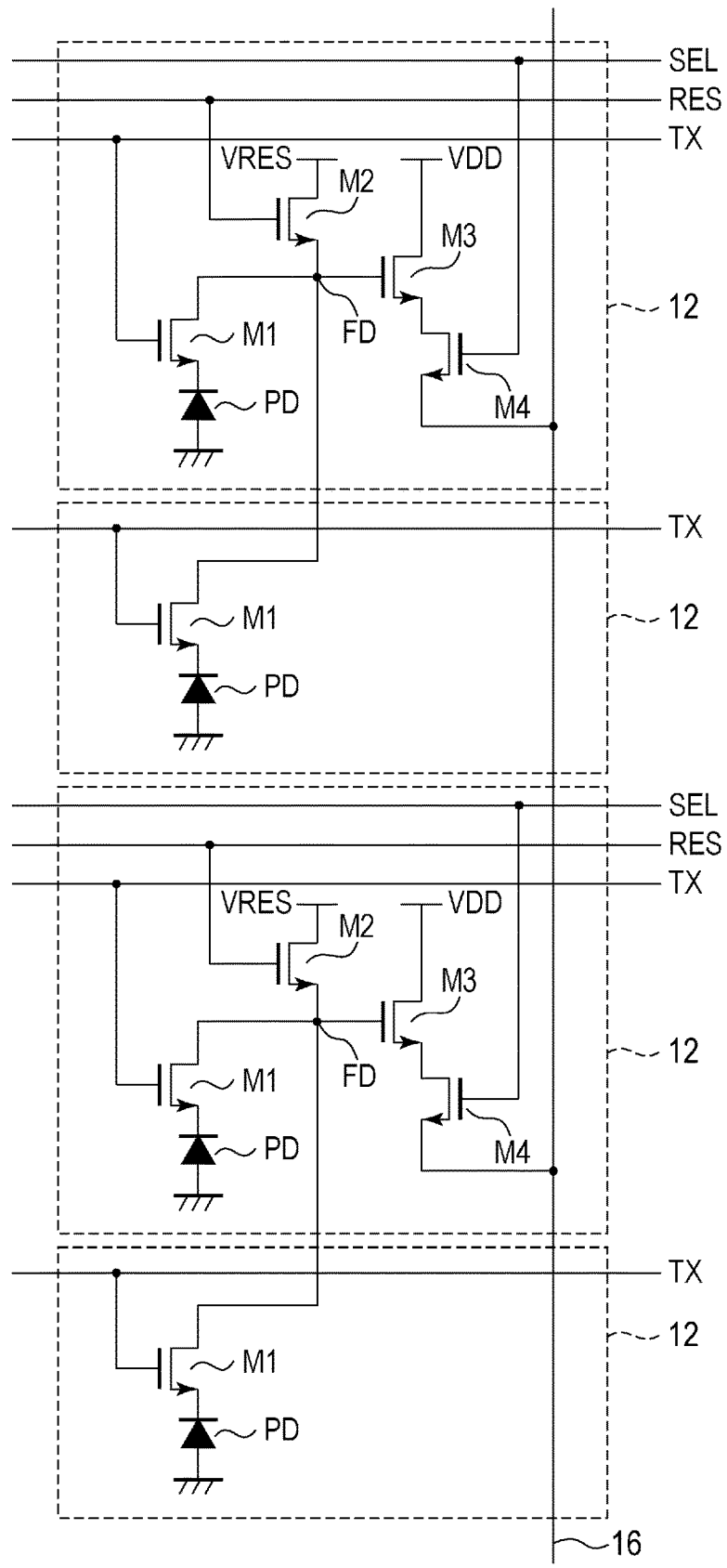
FIG. 2 is a circuit diagram illustrating a configuration example of a pixel of the imaging device according to the first embodiment of the present invention.

An imaging device and a method of manufacturing the same according to a first embodiment of the present invention will be described with reference to FIG. 1 to FIG. 10C. FIG. 1 is a block diagram illustrating a schematic configuration of an imaging device according to the present embodiment. FIG. 2 is a circuit diagram illustrating a configuration example of a pixel of the imaging device according to the present embodiment. FIG. 3A to FIG. 3C are a plan view and cross-sectional views illustrating the structure of the imaging device according to the present embodiment. FIG. 4A and FIG. 4B are diagrams illustrating advantages of the imaging device according to the present embodiment. FIG. 5A to FIG. 10C are plan views and cross-sectional views illustrating the method of manufacturing the imaging device according the present embodiment.

First, the structure of the imaging device according to the present embodiment will be described by using FIG. 1 to FIG. 3C.

As illustrated in FIG. 1, an imaging device 100 according to the present embodiment includes a pixel region 10, a vertical scanning circuit 20, a readout circuit 30, a horizontal scanning circuit 40, a control circuit 50, and an output circuit 60.

In the pixel region 10, a plurality of pixels 12 arranged in a matrix over a plurality of rows by a plurality of columns are provided. On each row of a pixel array of the pixel region 10, control lines 14 are arranged extending in a first direction (the horizontal direction in FIG. 1). Each of the control lines 14 is connected to the pixels 12 arranged in the first direction, respectively, to form a signal line common to these pixels 12. In the present specification, the first direction in which the control line 14 extends may be denoted as a row direction.

Further, on each column of the pixel array of the pixel region 10, output lines 16 are arranged extending in a second direction (the vertical direction in FIG. 1) intersecting the first direction. Each of the output lines 16 is connected to the pixels 12 arranged in the second direction, respectively, to form a signal line common to these pixels 12. In the present specification, the second direction in which the output line 16 extends may be denoted as a column direction.

The vertical scanning circuit 20 is connected to the control lines 14 arranged on respective rows of the pixel region 10. The vertical scanning circuit 20 is a circuit unit that supplies, to the pixels via the control lines 14, control signals that drive readout circuits within the pixels 12 when pixel signals are read from the pixels 12.

The readout circuit 30 is connected to the output lines 16 on respective columns of the pixel region 10. The pixel signal read out from the pixel 12 is input to the readout circuit 30 via the output line 16. The readout circuit 30 is a circuit unit that performs predetermined signal processing, for example, signal processing such as an amplification process, AD conversion process, or the like on the pixel signals read out from the pixels 12. The readout circuit 30 may include differential amplifier circuits, sample and hold circuits, AD converter circuits, or the like.

The horizontal scanning circuit 40 is a circuit unit that supplies, to the readout circuit 30, control signals for transferring signals processed in the readout circuit 30 to the output circuit 60 sequentially on a column basis. The output circuit 60 is a circuit unit that is formed of a buffer amplifier, a differential amplifier, or the like and outputs the pixel signal read out from the readout circuit 30 to a signal processing unit that outside the imaging device 100.

The control circuit 50 is a circuit unit for supplying control signals that control operations of the vertical scanning circuit 20, the readout circuit 30, and the horizontal scanning circuit 40 or the timings thereof. Some or all of the control signals to be supplied to the vertical scanning circuit 20, the readout circuit 30, and the horizontal scanning circuit 40 may be supplied from the outside of the imaging device 100.

FIG. 2 is a circuit diagram illustrating an example of a pixel circuit forming the pixel region 10. FIG. 2 illustrates four pixels 12 arranged in four rows by one column extracted out of the pixels 12 forming the pixel region 10. Note that the number or arrangement of the pixels 12 forming the pixel region 10 are not limited in particular.

Each of the pixels 12 includes the photoelectric conversion portion PD and a transfer transistor M1 as illustrated in FIG. 2. Further, neighboring two pixels 12 share a reset transistor M2, an amplifier transistor M3, and a select transistor M4. In the example of FIG. 2, the reset transistor M2, the amplifier transistor M3, and the select transistor M4 are shared in the pixel 12 on the top row and the pixel 12 on the second row from the top and are shared in the pixel 12 on the third row from the top and the pixel 12 on the fourth row from the top, respectively.

The photoelectric conversion portion PD is a photodiode, for example. In the photodiode of the photoelectric conversion portion PD, the anode is connected to a ground voltage terminal, and the cathode is connected to the source of the transfer transistor M1. The drain of the transfer transistor M1 is connected to the source of the reset transistor M2 and the gate of the amplifier transistor M3. The connection node of the drain of the transfer transistor M1, the source of the reset transistor M2, and the gate of the amplifier transistor M3 is a so-called floating diffusion region (floating diffusion FD). The parasitic capacitor coupled to the floating diffusion FD (floating diffusion capacitance) has a function as a charge holding portion. The drain of the reset transistor M2 is connected to a power source voltage line (VRES). The drain of the amplifier transistor M3 is connected to a power source voltage terminal (VDD). The source of the amplifier transistor M3 is connected to the drain of the select transistor M4. The source of the select transistor M4 is connected to the output line 16.

The control line 14 on each row includes a transfer gate signal line TX, a reset signal line RES, and a select signal line SEL in the case of the circuit configuration illustrated in FIG. 2. The transfer gate signal line TX is connected to the gate of the transfer transistor M1. The reset signal line RES is connected to the gate of the reset transistor M2. The select signal line SEL is connected to the gate of the select transistor M4.

The photoelectric conversion portion PD converts (photoelectrically converts) an incident light to an amount of charges in accordance with the light amount and accumulates the generated charges. When turned on, the transfer transistor M1 transfers charges in the photoelectric conversion portion PD to the floating diffusion FD. The floating diffusion FD is set to a voltage in accordance with the amount of charges transferred from the photoelectric conversion portion PD by charge-to-voltage conversion due to the capacitance component of the floating diffusion FD. The amplifier transistor M3 has a configuration in which a power source voltage is supplied to the drain and a bias current is supplied to the source from a current source (not illustrated) via the select transistor M4, and forms an amplifier unit (source follower circuit) whose gate is the input node. Thereby, the amplifier transistor M3 outputs a signal based on the voltage of the floating diffusion FD to the output line 16 via the select transistor M4. When turned on, the reset transistor M2 resets the floating diffusion FD to a voltage in accordance with the voltage VRES.

FIG. 3A is a diagram illustrating a plan layout of the pixel region 10 of the imaging device according to the present embodiment. FIG. 3B is a cross-sectional view taken along the line A-A' of FIG. 3A. FIG. 3C is a cross-sectional view taken along the line B-B' of FIG. 3A.

FIG. 3A illustrates only the photoelectric conversion portion PD and the transfer transistor M1 out of components of the four pixels 12 aligned in the column direction (corresponding to the four pixels 12 of FIG. 2). Other elements in the pixel 12, that is, the reset transistor M2, the amplifier transistor M3, and the select transistor M4 are arranged on the right side or the left side of the pixel arrangement illustrated in FIG. 3A. In FIG. 3A, each of the regions surrounded by a one-dot-chain line indicates a region where the photoelectric conversion portion PD and the transfer transistor M1 are arranged of a single pixel 12. In FIG. 3A, each of these regions is denoted by the reference numeral in the pixel 12.

As illustrated in FIG. 3C, element isolation regions 112 defining an active region are provided on the surface part of an n-type silicon substrate 110. The element isolation regions 112 define stripe active region extending in the column direction, and the photoelectric conversion portions PD, the transfer transistors M1, and the floating diffusions FD of the plurality of pixels 12 aligned in the column direction are arranged in this active region.

The photoelectric conversion portion PD includes a p-type semiconductor region 144 (first semiconductor region) provided on the surface part of the silicon substrate 110 and an n-type semiconductor region 134 (second semiconductor region) provided adjacent to the bottom of the p-type semiconductor region 144 inside the silicon substrate 110. Alternatively, the photoelectric conversion portion PD includes a p-type semiconductor region 150 (third semiconductor region) provided on the surface part of the silicon substrate 110 and the n-type semiconductor region 134 (fourth semiconductor region) provided adjacent to the bottom part of the p-type semiconductor region 150 inside the silicon substrate 110. Each of the photoelectric conversion portions PD has the buried diode structure in which the n-type semiconductor region 134 is a charge accumulation layer. The pixels 12 including the photoelectric conversion portion PD formed of the n-type semiconductor region 134 and the p-type semiconductor region 144 and the pixels 12 including the photoelectric conversion portion PD formed of the n-type semiconductor region 134 and the p-type semiconductor region 150 are arranged in an alternating manner in the column direction. Note that, while the p-type semiconductor region 144 and the p-type semiconductor region 150 are denoted by using different reference numerals because they are formed separately, the p-type semiconductor region 144 and the p-type semiconductor region 150 are semiconductor regions having substantially the same characteristic or function.

The floating diffusion FD is formed of an n-type semiconductor region 158 provided spaced apart from the n-type semiconductor region 134 on the surface part of the silicon substrate 110.

The transfer transistor M1 includes a gate electrode 138 provided via a gate insulating film 136 on the silicon substrate 110 between the n-type semiconductor region 134 and the n-type semiconductor region 158. The n-type semiconductor region 134 corresponds to the source of the transfer transistor M1, and the n-type semiconductor region 158 corresponds to the drain of the transfer transistor M1.

Two pixels 12 sharing the floating diffusion FD (n-type semiconductor region 158) are arranged symmetrically about the floating diffusion FD as the center as illustrated in FIG. 3A. With the arrangement of these two pixels 12 being defined as a fundamental unit, a plurality of fundamental units are arranged repeatedly in the column direction.

The pixels 12 which do not share the floating diffusion FD but neighbor in the column direction are arranged such that the photoelectric conversion portions PD neighbor to each other. One of the photoelectric conversion portions PD of these pixels 12 includes the p-type semiconductor region 144, and the other includes the p-type semiconductor region 150. A p-type semiconductor region 152 (fifth semiconductor region) is provided on the surface part of the silicon substrate 110 between the photoelectric conversion portions PD of these pixels 12, that is, between the p-type semiconductor region 144 and the p-type semiconductor region 150. The p-type semiconductor region 152 is a high concentration p-type semiconductor region in which both a p-type impurity introduced when the p-type semiconductor region 144 is formed and a p-type impurity introduced when the p-type semiconductor region 150 is formed are introduced.

Within the silicon substrate 110 between the pixels 12 which do not share the floating diffusion FD but neighbor in the column direction, p-type semiconductor regions 122 and 128 (sixth semiconductor region) for isolating these pixels 12 are provided. At a deep part of the silicon substrate 110, a p-type semiconductor region 116 that defines the depth of the photoelectric conversion portion PD is provided.

On the silicon substrate 110, an interlayer insulating film 166 is provided. A contact plug 172 electrically connected to the p-type semiconductor regions 128, 122, and 116 via a p-type contact region 170 (eighth semiconductor region), and a p-type semiconductor region 164 (seventh semiconductor region) is provided in the interlayer insulating film 166. The contact plug 172 is a contact electrode used for supplying a predetermined voltage to a well.

As discussed above, in the imaging device according to the present embodiment, between the p-type semiconductor regions (the p-type semiconductor regions 144 and 150) of the neighboring photoelectric conversion portions PD of the neighboring pixels 12, the p-type semiconductor region 152 having a higher impurity concentration than the above is provided. Such a configuration can improve the isolation property between the photoelectric conversion portions PD of these pixels 12.

FIG. 4A and FIG. 4B are diagrams illustrating a potential state in a region between the photoelectric conversion portions PD of the neighboring pixels 12. FIG. 4B illustrates a potential distribution when the p-type semiconductor region 152 is provided and corresponds to the imaging device of the present embodiment. As a comparison, FIG. 4A illustrates a potential distribution when the p-type semiconductor region 152 is not provided. That is, in FIG. 4A, it is assumed that the p-type semiconductor region 144 is provided continuously between the photoelectric conversion portions PD of the neighboring pixels 12.

As illustrated in FIG. 4A and FIG. 4B, with p-type semiconductor region 152 being provided between these photoelectric conversion portions PD of the neighboring pixels 12, the potential barrier between the pixels 12 can be higher compared to the case where the p-type semiconductor region 152 is not provided. Therefore, the isolation property between these pixels 12 can be enhanced, and leakage of charges to the neighboring pixel 12 can be effectively suppressed.

In addition that the p-type semiconductor region 152 has the function of improving the isolation property between the photoelectric conversion portions PD of the neighboring pixels 12, it is effective to utilize the p-type semiconductor region 152 as a place where a well contact is arranged. That is, the p-type semiconductor region 152 is a high concentration p-type semiconductor region where the p-type impurities, which are introduced when the p-type semiconductor regions 144 and 150 are formed, are repeatedly introduced and is useful in reducing the contact resistance with the contact plug 172.

Further, when channel stop regions 114 (ninth semiconductor region) are provided to the sidewall part and the bottom part of the element isolation regions 112, it is desirable for the p-type semiconductor region 152 to be connected to the channel stop regions 114 on the sidewall parts of the element isolation regions 112 (see FIG. 3C). Thereby, the connection resistance between the p-type semiconductor region 152 and the channel stop regions 114 can be reduced, and a well electric potential can be easily taken in the channel stop regions 114. Therefore, the region near the element isolation regions 112 is less likely to be depleted, and a dark state noise occurring near the element isolation regions 112 can be reduced.

Next, a method of manufacturing the imaging device according to the present embodiment will be described by using FIG. 5A to FIG. 10C.

First, the element isolation regions 112 that define an active region are formed by a LOCOS (LOCal Oxidation of Silicon) method, an STI (Shallow Trench Isolation) method, or the like, for example on a semiconductor substrate, for example, the n-type silicon substrate 110. At this time, the channel stop regions 114 are formed by ion implantation of p-type impurity into the sidewall parts and the bottom parts of the element isolation regions 112. The channel stop regions 114 are formed so as to at least partially overlap with a region where the p-type semiconductor regions 144 and the p-type semiconductor region 150 overlap with each other (the p-type semiconductor region 152). Thereby, a resistance between the channel stop regions 114 and the contact plug 172 can be reduced, and a well electric potential can be easily taken in the channel stop regions 114.

Next, at a deep part of the silicon substrate 110, the p-type semiconductor region 116 that defines the depth of the photoelectric conversion portion PD is formed by ion implantation of the p-type impurity such as boron (B) (FIGS. 5A, 5B and 5C).

Next, a photoresist film 118 having openings 120 in regions between the pixels 12 is formed by photolithography.

Next, the p-type semiconductor regions 122 that function as an inter-pixel isolation region at a deep part is formed in a position shallower than the p-type semiconductor region 116 of the silicon substrate 110 by ion implantation of the p-type impurity such as boron (B) by using the photoresist film 118 as a mask (FIGS. 6A and 6B).

Next, the photoresist film 118 is removed by ashing, for example.

Next, a photoresist film 124 having an opening 126 in a region between the pixels 12 except a region to become the floating diffusion FD is formed by photolithography.

Next, the p-type semiconductor region 128 that functions as an inter-pixel isolation region at a shallow part is formed in a position shallower than the p-type semiconductor regions 122 of the silicon substrate 110 by ion implantation of the p-type impurity such as boron (B) by using the photoresist film 124 as a mask (FIGS. 6A and 6C).

Note that the p-type semiconductor region 128 may be formed also in the region to become the floating diffusion FD as long as it does not affect charge transfer from the photoelectric conversion portion PD to the floating diffusion FD.

Next, the photoresist film 124 is removed by ashing, for example.

Next, a photoresist film 130 having openings 132 in the regions where the photoelectric conversion portions PD are formed is formed by photolithography.

Next, the n-type semiconductor regions 134 to become charge accumulation regions of the photoelectric conversion portions PD are formed by ion implantation of the n-type impurity such as phosphorus (P) or arsenic (As) by using the photoresist film 130 as a mask (FIGS. 7A and 7B).

Next, the photoresist film 130 is removed by ashing, for example.

Next, a gate insulating film 136 made of a silicon oxide film or the like is formed on the surface of the silicon substrate 110 by a thermal oxidation method, a CVD method, or the like, for example.

Next, the gate electrodes 138 of the transfer transistors M1 are formed on the gate insulating film 136 by depositing and patterning a conductive film such as a polycrystalline silicon film or the like (FIGS. 7A and 7C).

Next, a photoresist film 140 having an opening 142 that exposes one of the photoelectric conversion portions PD of the two pixels 12 which share the floating diffusion FD is formed by photolithography. The opening 142 is formed so as to extend to the isolation portion between the neighboring pixels 12 which do not share the floating diffusion FD.

Next, the p-type semiconductor region 144 for burying the photoelectric conversion portion PD is formed on the surface part of the silicon substrate 110 by ion implantation of the p-type impurity such as boron (B) by using the photoresist film 140 and the gate electrode 138 as a mask. It is desirable that ion implantation be made from an oblique direction inclined on this gate electrode 138 side so that the p-type semiconductor region 144 is spaced apart from the gate electrode 138 (FIGS. 8A and 8B).

Next, the photoresist film 140 is removed by ashing, for example.

Next, a photoresist film 146 having an opening 148 that exposes the other of the photoelectric conversion portions PD of the two pixels 12 which share the floating diffusion FD is formed by photolithography. The opening 148 is formed so as to extend to the isolation portion between the neighboring pixels 12 which do not share the floating diffusion FD.

Next, the p-type semiconductor region 150 for burying the photoelectric conversion portion PD is formed on the surface part of the silicon substrate 110 by ion implantation of the p-type impurity such as boron (B) by using the photoresist film 146 and the gate electrode 138 as a mask. It is desirable that ion implantation be made from an oblique direction inclined on this gate electrode 138 side so that the p-type semiconductor region 150 is spaced apart from the gate electrode 138.

Thereby, the high concentration p-type semiconductor region 152 into which the p-type impurities forming the p-type semiconductor regions 144 and 150 are repeatedly ion-implanted is formed in the isolation portion between the neighboring pixels 12 which do not share the floating diffusion FD (FIGS. 9A and 9B).

The p-type semiconductor region 144 and the p-type semiconductor region 150 are formed separately by ion implantation performed from different directions, as illustrated in FIG. 8B and FIG. 9B. Therefore, the p-type semiconductor region 152 can be formed by changing patterns of the photoresist films 140 and 146, and no special step for forming the p-type semiconductor region 152 is required to be added.

Note that, while only the four pixels 12 are illustrated and the p-type semiconductor region 152 is formed in a single portion for simplicity in the present embodiment, the p-type semiconductor regions 152 are periodically formed between the pixels 12 where the photoelectric conversion portions PD neighbor to each other in the column direction.

Next, the photoresist film 146 is removed by ashing, for example.

Next, a photoresist film 154 having an opening 156 in a region between the gate electrodes 138 of the two pixels 12 that share the floating diffusion FD is formed by photolithography.

Next, the n-type semiconductor region 158 forming the floating diffusion FD is formed by ion implantation of the n-type impurity such as phosphorus (P) or arsenic (As) by using the photoresist film 154 as a mask (FIGS. 9A and 9C).

Next, the photoresist film 154 is removed by ashing, for example.

Next, a photoresist film 160 having an opening 162 in a region where the p-type semiconductor region 152 is provided is formed on the silicon substrate 110 by photolithography. Note that the opening 162 corresponds to a region forming a well contact used for supplying a predetermined voltage to a well. The opening 162 is not necessarily required to be arranged above all the p-type semiconductor regions 152.

Next, a p-type semiconductor region 164 is formed between the p-type semiconductor region 152 and the p-type semiconductor regions 122 and 128 by ion-implantation of the p-type impurity such as boron (B) by using the photoresist film 160 as a mask (FIGS. 10A and 10B).

Next, the photoresist film 160 is removed by ashing, for example.

Next, an interlayer insulating film 166 is formed by depositing an insulating film such as a silicon oxide film on the silicon substrate 110 by a CVD method or the like, for example.

Next, a contact hole 168 arranged above the p-type semiconductor region 164 is formed in the interlayer insulating film 166 by photolithography and dry etching.

Next, a p-type contract region 170 is formed on the surface part of the silicon substrate 110 inside the contact hole 168 by ion implantation of the p-type impurity such as boron (B) by using the interlayer insulating film 166 as a mask. The p-type contact region 170 is provided to the connection part between the p-type semiconductor region 152 and the contact plug 172.

Note that it is desirable for the p-type semiconductor region 164 and the p-type contact region 170 to be arranged in a position such that the two pixels 12 interposing them are symmetrical. With such a configuration, the difference between dark state noises in these pixels 12 can be reduced.

Further, the p-type semiconductor region 164 and the p-type contact region 170 are to reduce the contact resistance between the contact plug 172 and the p-type semiconductor regions 152 and 128. When the contact resistance between the contact plug 172 and the p-type semiconductor regions 152 and 128 is sufficiently low, it is not necessary to provide one of or both of the p-type semiconductor region 164 and the p-type contact region 170.

Next, heat treatment is performed in a nitrogen atmosphere, for example, and crystal defect introduced in the silicon substrate 110 when the p-type contact region 170 is formed is recovered.

Note that it is desirable to perform the heat treatment for recovering crystal defect introduced in the silicon substrate 110 also after forming the p-type semiconductor regions 144 and 150 and after forming the p-type semiconductor region 164. In terms of easier recovery of the crystal defect, it is preferable to perform the heat treatment in multiple times after forming the p-type semiconductor regions 144 and 150 and after forming the p-type semiconductor region 164 rather than to perform the heat treatment only after forming the p-type contact region 170. This allows for easier recovery of the crystal defect and a reduced dark state noise.

Next, after a barrier metal and a tungsten are deposited on the interlayer insulating film 166 in which the contract hole 168 is provided, the contact plug 172 arranged inside the contact hole 168 is formed by polish back of these conductive films (FIGS. 10A and 10C).

Then, not-illustrated multilayer wirings, a color filter, a micro-lens, or the like is formed, and the imaging device according to the present embodiment is completed.

As discussed above, according to the present embodiment, in an imaging device having buried diodes, the isolation property between buried diodes arranged adjacently can be improved without making a manufacturing process complex. Thereby, crosstalk of signals between neighboring pixels 12 can be suppressed.

Second Embodiment

Figure 11A:
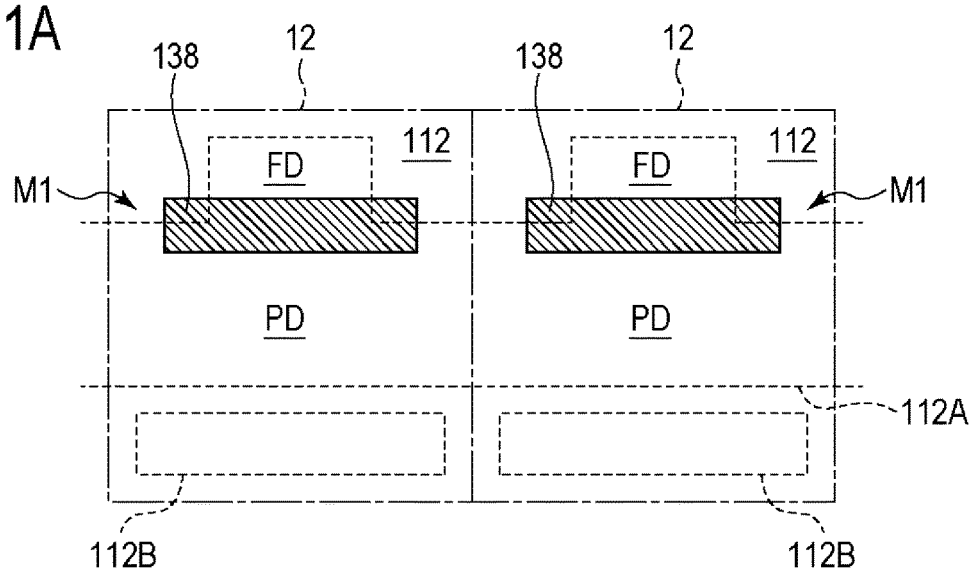
FIG. 11A, FIG. 11B, and FIG. 11C are plan views illustrating an imaging device and a method of manufacturing the same according to a second embodiment of the present invention.
Figure 11B:
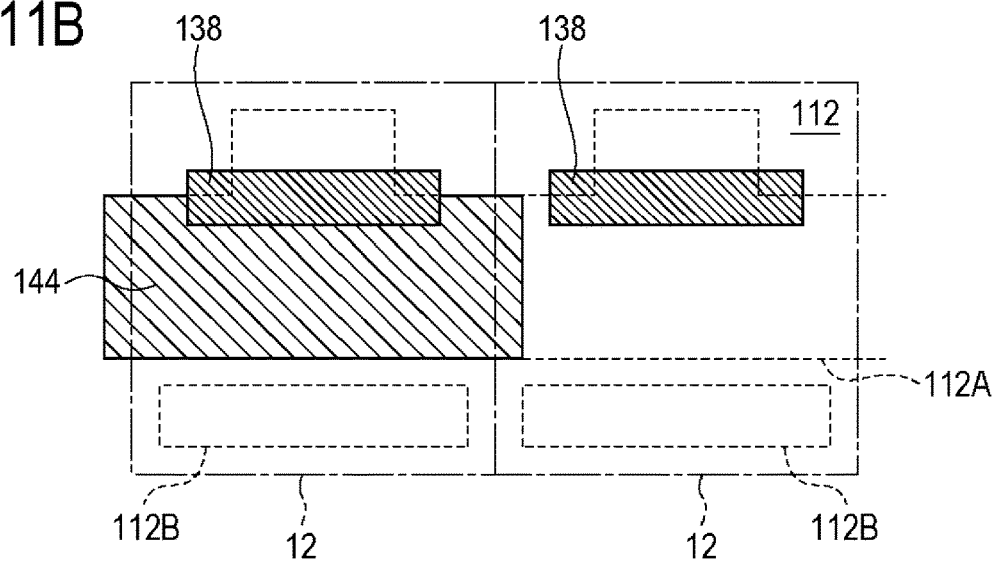
Figure 11C:
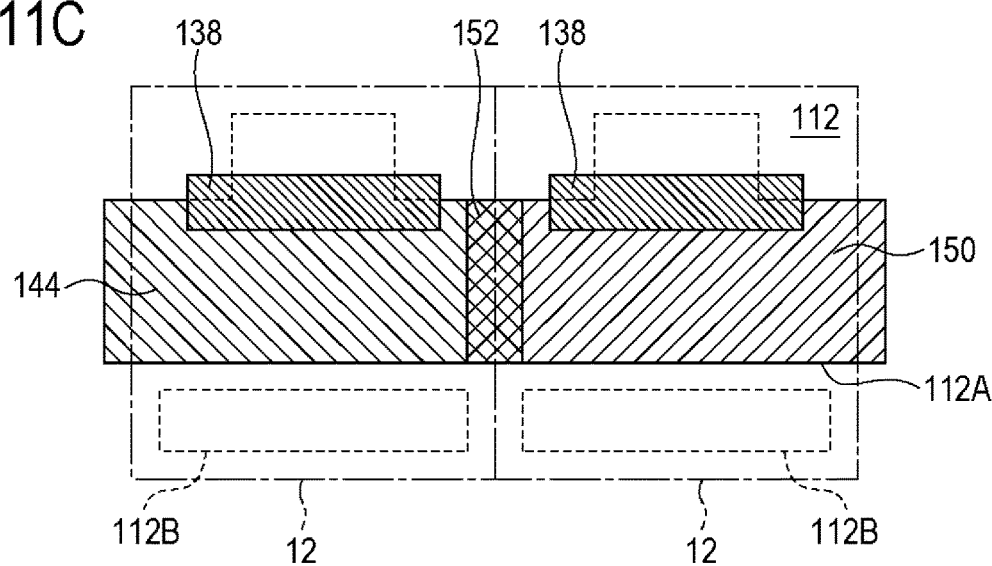

An imaging device and a method of manufacturing the same according to a second embodiment of the present invention will be described with reference to FIG. 11A to FIG. 11C. The same components as those in the imaging device according to the first embodiment are labeled with the same reference numerals, and the description thereof will be omitted or simplified. FIG. 11A to FIG. 11C are plan views illustrating the imaging device and the method of manufacturing the same according to the present embodiment.

While an example in which the p-type semiconductor region 152 is arranged between the photoelectric conversion portions PD of the pixels 12 neighboring in the column direction has been illustrated in the first embodiment, the p-type semiconductor region 152 may be arranged between the photoelectric conversion portions PD of the pixels 12 neighboring in the row direction.

In the imaging device according to the present embodiment, the element isolation regions 112 define a stripe active region 112A extending in the row direction. Within the active region 112A, the photoelectric conversion portions PD, the transfer transistors M1, and the floating diffusions FD of the plurality of pixels 12 aligned in the row direction are arranged. Each of active regions 112B neighboring in the column direction of the active region 112A and provided for each of the pixels 12 is a region where a readout circuit unit including the reset transistor M2, the amplifier transistor M3, and the select transistor M4 is arranged.

In the method of manufacturing the imaging device according to the present embodiment, the p-type semiconductor regions of the photoelectric conversion portions PD of the neighboring pixels 12 are formed by separate ion implanting steps in a similar manner to the case of the first embodiment. That is, after the p-type semiconductor region 144 forming the photoelectric conversion portion PD of one pixel 12 is formed (FIG. 11B), the p-type semiconductor region 150 forming the photoelectric conversion portion PD of the pixel 12 neighboring in the row direction of the one pixel 12 is formed (FIG. 11C). At this time, a region into which both the p-type impurity introduced when the p-type semiconductor region 144 is formed and the p-type impurity introduced when the p-type semiconductor region 150 is formed are introduced is provided between these pixels 12. Thereby, between the p-type semiconductor region 144 and the p-type semiconductor region 150, the p-type semiconductor region 152 having a higher concentration than these regions is formed.

With such a configuration, the isolation property between the pixels 12 neighboring in the row direction can be enhanced, and leakage of charges to the neighboring pixel 12 can be effectively suppressed.

As discussed above, according to the present embodiment, in an imaging device having buried diodes, the isolation performance between buried diodes arranged adjacently can be improved without making a manufacturing process complex. Thereby, crosstalk of signals between neighboring pixels 12 can be suppressed.

Third Embodiment

An imaging device and a method of manufacturing the same according to a third embodiment of the present invention will be described with reference to FIG. 12A to FIG. 12C. The same components as those in the imaging device according to the first and second embodiments are labeled with the same reference numerals, and the description thereof will be omitted or simplified. FIG. 12A to FIG. 12C are plan views illustrating the imaging device and the method of manufacturing the same according to the present embodiment.

While an example in which the p-type semiconductor region 152 is arranged between the photoelectric conversion portions PD of the pixels 12 neighboring in the column direction has been illustrated in the first embodiment, the p-type semiconductor region 152 may be arranged between the photoelectric conversion portions PD and a charge holding portion MEM of the pixels 12 neighboring.

An imaging device having a global electronic shutter function has the charge holding portion MEM capable of holding charges separately from the photoelectric conversion portion PD. The charge holding portion MEM can be formed by the same buried diode structure as the photoelectric conversion portion PD. In this case, by providing a high concentration p-type semiconductor region between the p-type semiconductor region of the photoelectric conversion portion PD and the p-type semiconductor region of the charge holding portion MEM of the neighboring pixels 12, it is possible to increase the potential barrier between them.

FIG. 12A illustrates an example of a plan layout of an imaging device having a global electronic shutter function. The photoelectric conversion portions PD, the charge holding portions MEM, and the floating diffusions FD of the pixels 12 neighboring in the column direction are arranged within a single active region 112A. In this layout, since the photoelectric conversion portion PD and the charge holding portion MEM of the neighboring pixels 12 are arranged adjacently, it is necessary to increase the potential barrier between them and suppress leakage of charges from the photoelectric conversion portion PD to the charge holding portion MEM of the neighboring pixels 12.

Accordingly, in the method of manufacturing the imaging device according to the present embodiment, the p-type semiconductor region of the photoelectric conversion portion PD and the p-type semiconductor region of the charge holding portion MEM of the neighboring pixels 12 are formed by separate ion implanting steps in a similar manner to the case of the first embodiment. That is, after forming the p-type semiconductor region 144 of the photoelectric conversion portion PD of one pixel 12 (FIG. 12B), the p-type semiconductor region 150 of the charge holding portion MEM of the pixel 12 neighboring to the one pixel 12 in the column direction is formed (FIG. 12C). At this time, a region into which both the p-type impurity introduced when the p-type semiconductor region 144 is formed and the p-type impurity introduced when the p-type semiconductor region 150 is formed are introduced is provided between these pixels 12. Thereby, between the p-type semiconductor region 144 and the p-type semiconductor region 150, the p-type semiconductor region 152 having a higher concentration than these regions is formed.

With such a configuration, the isolation property between the pixels 12 neighboring in the row direction can be enhanced, and leakage of charges to the neighboring pixel 12 can be effectively suppressed.

As discussed above, according to the present embodiment, in an imaging device having buried diodes, the isolation performance between buried diodes arranged adjacently can be improved without making a manufacturing process complex. Thereby, crosstalk of signals between neighboring pixels 12 can be suppressed.

Fourth Embodiment

Figure 13:
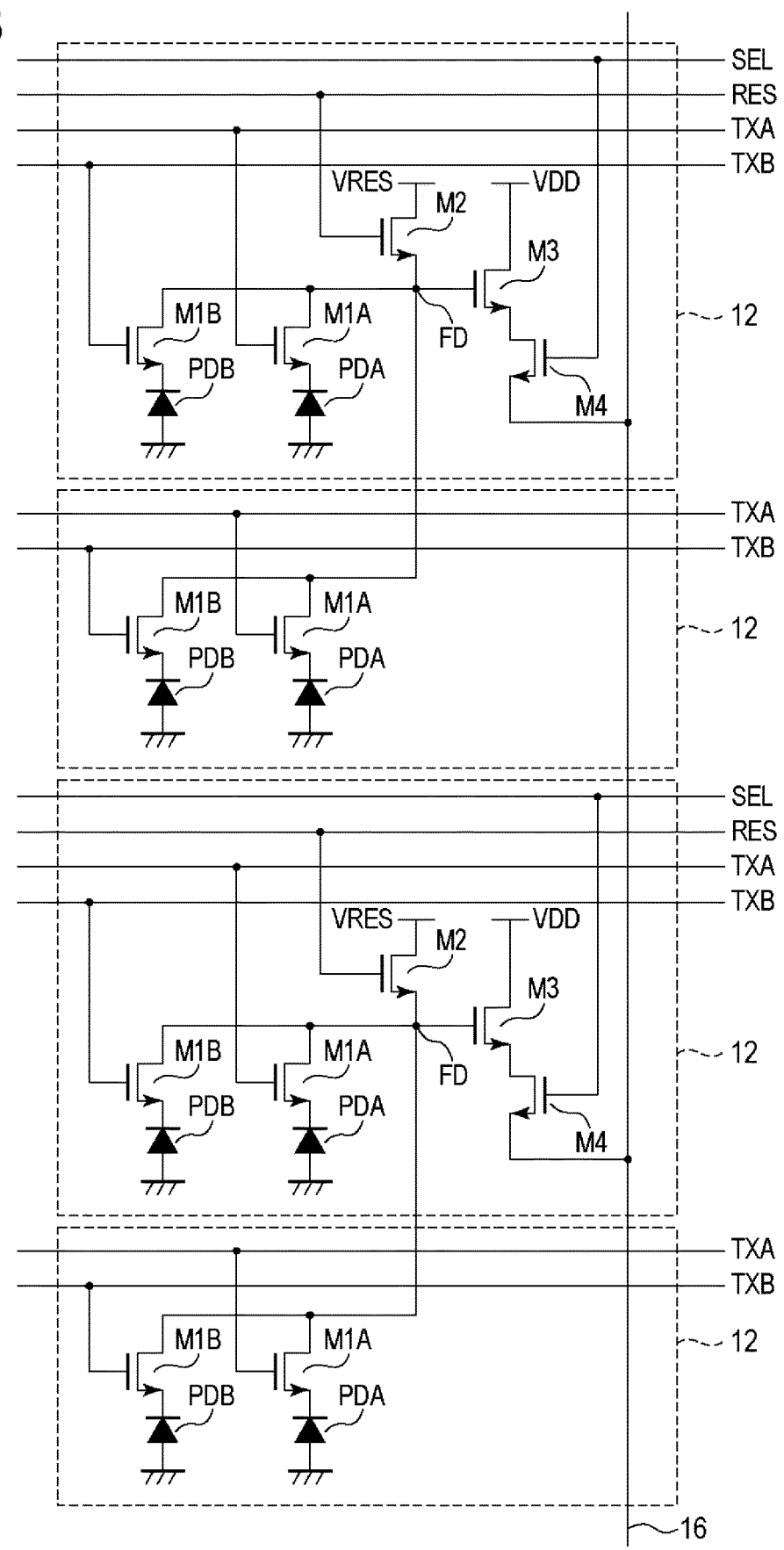
FIG. 13 is a circuit diagram illustrating a configuration example of a pixel of an imaging device according to a fourth embodiment of the present invention.
Figure 14:
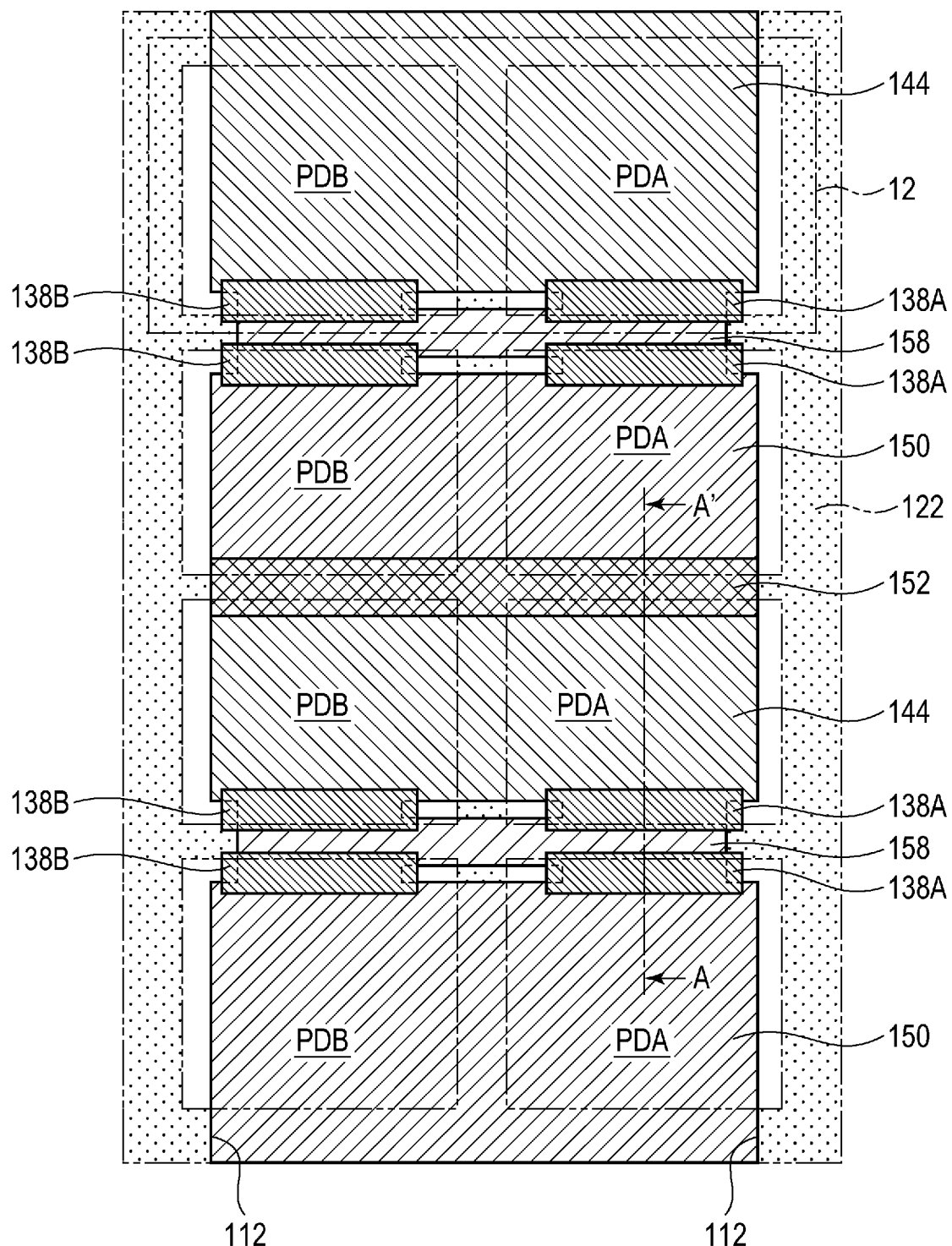
FIG. 14 is a plan view illustrating the structure of the imaging device according to the fourth embodiment of the present invention.

An imaging device and a method of manufacturing the same according to a fourth embodiment of the present invention will be described with reference to FIG. 13 and FIG. 14. The same components as those in the imaging device according to the first to third embodiments are labeled with the same reference numerals, and the description thereof will be omitted or simplified. FIG. 13 is a circuit diagram illustrating a configuration example of pixels in the imaging device according to the present embodiment. FIG. 14 is a plan view illustrating the structure of the imaging device according to the present embodiment.

The imaging device according to the present embodiment is different from the imaging device according to the first embodiment in that each of the pixels 12 has two photoelectric conversion portions PDA and PDB and two transfer transistors M1A and M1B as illustrated in FIG. 13. The photoelectric conversion portions PDA and PDB of a single pixel 12 share a single micro lens (not illustrated) and are configured to receive incident lights passing through different pupil regions of the imaging optical system, respectively. Such a configuration enables focus detection of a phase difference scheme based on a signal from the photoelectric conversion portion PDA and a signal from the photoelectric conversion portion PDB.

A readout circuit unit (the reset transistor M2, the amplifier transistor M3, and the select transistor M4) is shared by the neighboring two pixels 12, which is the same as the imaging device according to the first embodiment. In the imaging device according to the present embodiment, it can be said that four photoelectric conversion portions PDA and PDB of two pixels share a readout circuit unit.

The photoelectric conversion portions PDA and PDB are photodiodes, for example. In the photodiode of the photoelectric conversion portion PDA, the anode is connected to the ground voltage terminal, and the cathode is connected to the source of the transfer transistor M1A. In the photodiode of the photoelectric conversion portion PDB, the anode is connected to the ground voltage terminal, and the cathode is connected to the source of the transfer transistor M1B. The drains of the transfer transistors M1A and M1B are connected to the connection node of the source of the reset transistor M2 and the gate of the amplifier transistor M3, that is, the floating diffusion FD. The configuration of the readout circuit unit is the same as that of the imaging device according to the first embodiment.

In the case of the circuit configuration illustrated in FIG. 13, the control line 14 on each row includes transfer gate signal lines TXA and TXB, the reset signal line RES, and the select signal line SEL. The transfer gate signal line TXA is connected to the gate of the transfer transistor M1A. The transfer gate signal line TXB is connected to the gate of the transfer transistor M1B. The reset signal line RES is connected to the gate of the reset transistor M2. The select signal line SEL is connected to the gate of the select transistor M4.

FIG. 14 is a diagram illustrating a plan layout of the pixel region 10 of the imaging device according to the present embodiment. FIG. 14 illustrates only the photoelectric conversion portions PD and the transfer transistors M1A and M1B out of the components of four pixels 12 aligned in the column direction (corresponding to the four pixels 12 of FIG. 13). Other components of the pixels 12, that is, the reset transistors M2, the amplifier transistors M3, and the select transistors M4 are arranged on the right side or the left side of the pixel arrangement illustrated in FIG. 14. Each region surrounded by a one-dot-chain line in FIG. 14 indicates a region where the photoelectric conversion portions PDA and PDB and the transfer transistors M1A and M1B of a single pixel 12 are arranged.

The cross-section along the line A-A' of FIG. 14 is the same as that of the imaging device according to the first embodiment illustrated in FIG. 3B except that no well contact is provided. Between the p-type semiconductor regions (p-type semiconductor regions 144 and 150) of the photoelectric conversion portions PDA and PDB of the neighboring pixels 12, the p-type semiconductor region 152 having a higher impurity concentration than the above is provided, and thereby the isolation property of these pixels 12 can be improved.

The photoelectric conversion portion PDA and the photoelectric conversion portion PDB of a single pixel 12 are arranged adjacently in the row direction within the same active region. The photoelectric conversion portion PDA and the photoelectric conversion portion PDB are isolated by the p-type semiconductor regions 122 and 128. The p-type semiconductor region 144 or the p-type semiconductor region 150 forming the photoelectric conversion portions PDA and PDB of a single pixel 12 may be provided separately or may be continuous as illustrated in FIG. 14. With the p-type semiconductor region 144 or the p-type semiconductor region 150 being arranged also in a region between the photoelectric conversion portions PDA and PDB, combined with the p-type semiconductor regions 122 and 128, the isolation property between the photoelectric conversion portion PDA and the photoelectric conversion portion PDB of a single pixel 12 can be improved.

As discussed above, according to the present embodiment, in an imaging device having buried diodes, the isolation performance between buried diodes arranged adjacently can be improved without making a manufacturing process complex. Thereby, crosstalk of signals between neighboring pixels 12 can be suppressed.

Fifth Embodiment

Figure 15:
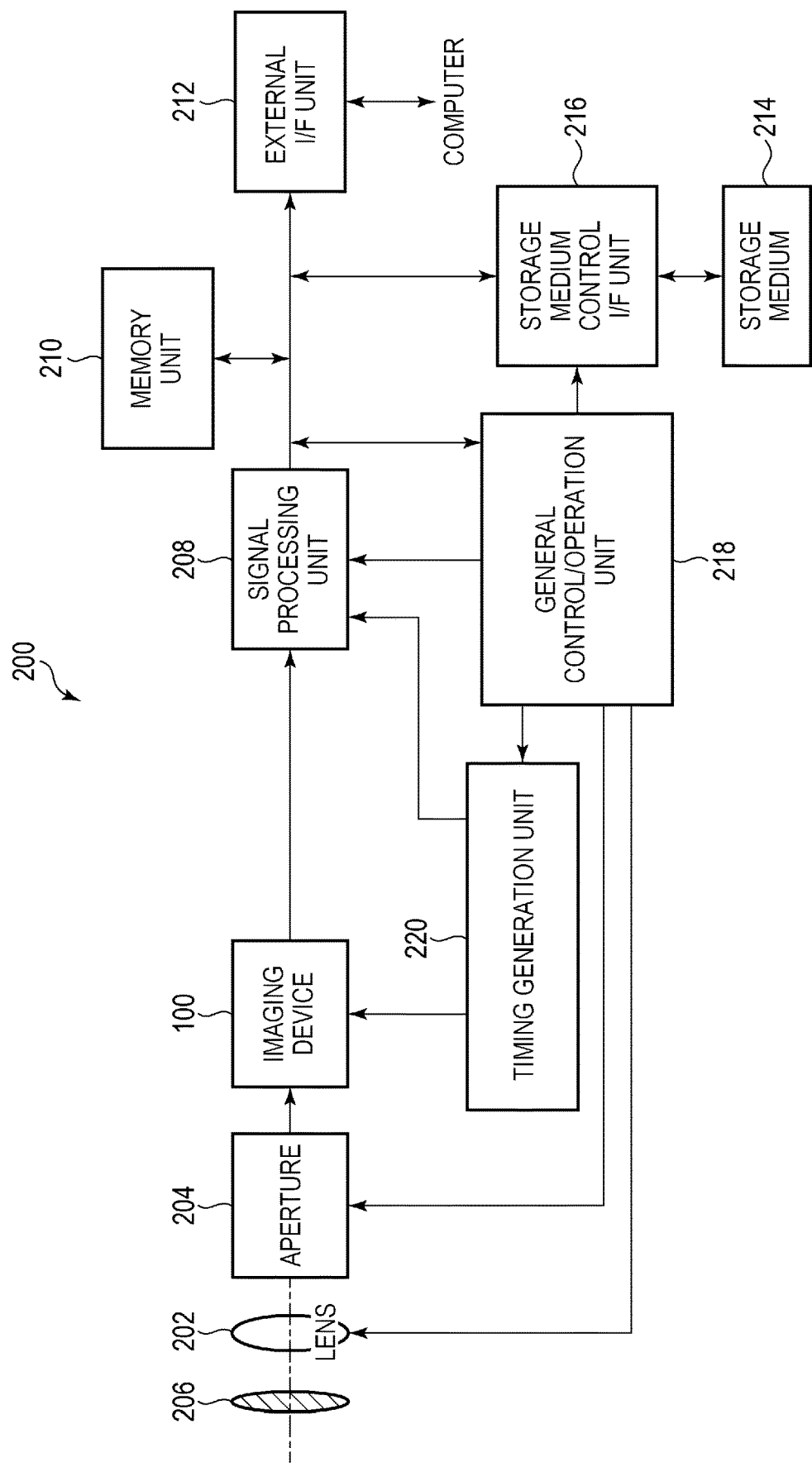
FIG. 15 is a block diagram illustrating a schematic configuration of an imaging system according to a fifth embodiment of the present invention.

An imaging system according to a fifth embodiment of the present invention will be described with reference to FIG. 15. The same components as those in the imaging device according to the first to fourth embodiments are labeled with the same reference symbols, and the description thereof will be omitted or simplified. FIG. 15 is a block diagram illustrating a general configuration of the imaging system according to the present embodiment.

The imaging system 200 of the present embodiment includes an imaging device 100 to which the configuration of any of the first to fourth embodiments described above is applied. Specific examples of the imaging system 200 may include a digital still camera, a digital camcorder, a surveillance camera, and the like. FIG. 15 illustrates a configuration example of a digital still camera to which the imaging device 100 described in any of respective embodiments described above is applied.

The imaging system 200 illustrated as an example in FIG. 15 has the imaging device 100, a lens 202 that captures an optical image of a subject onto the imaging device 100, an aperture 204 for changing a light amount passing through the lens 202, and a barrier 206 for protecting the lens 202. The lens 202 and the aperture 204 form an optical system that converges a light onto the imaging device 100.

The imaging system 200 further has a signal processing unit 208 that processes an output signal output from the imaging device 100. The signal processing unit 208 performs a signal processing operation of performing various correction and compression on an input signal for output, if necessary. For example, the signal processing unit 208 applies predetermined image processing such as a conversion process for converting RGB pixel output signals to the Y, Cb, and Cr color space or gamma correction on the input signal.

The imaging system 200 further has a memory unit 210 for temporarily storing image data therein and an external interface unit (external I/F unit) 212 for communicating with an external computer or the like. The imaging system 200 further has a storage medium 214 such as a semiconductor memory for performing storage or readout of imaging data and a storage medium control interface unit (storage medium control I/F unit) 216 for performing storage or readout on the storage medium 214. Note that the storage medium 214 may be embedded in the imaging system 200 or may be removable.

The imaging system 200 further has a general control/operation unit 218 that performs various operations and controls the entire digital still camera and a timing generation unit 220 that outputs various timing signals to the imaging device 100 and the signal processing unit 208. Here, the timing signal or the like may be input from the outside, and the imaging system 200 may have at least the imaging device 100 and the signal processing unit 208 that processes an output signal output from the imaging device 100. The general control/operation unit 218 and the timing generation unit 220 may be configured to perform a part or all of the control function of the imaging device 100.

The imaging device 100 outputs an imaging signal to the signal processing unit 208. The signal processing unit 208 performs predetermined signal processing on an imaging signal output from the imaging device 100 and outputs image data. Further, the signal processing unit 208 uses an imaging signal to generate an image. An image generated by the signal processing unit 208 is stored in the storage medium 214, for example. Further, an image generated by the signal processing unit 208 is displayed as a moving image or a static image on a monitor such as a liquid crystal display. The image stored in the storage medium 214 can be hard-copied by a printer or the like.

By using the imaging device of each of the embodiments described above to configure an imaging system, it is possible to realize an imaging system that can acquire a better image with less crosstalk of signals between neighboring pixels.

Sixth Embodiment

Figure 16A:
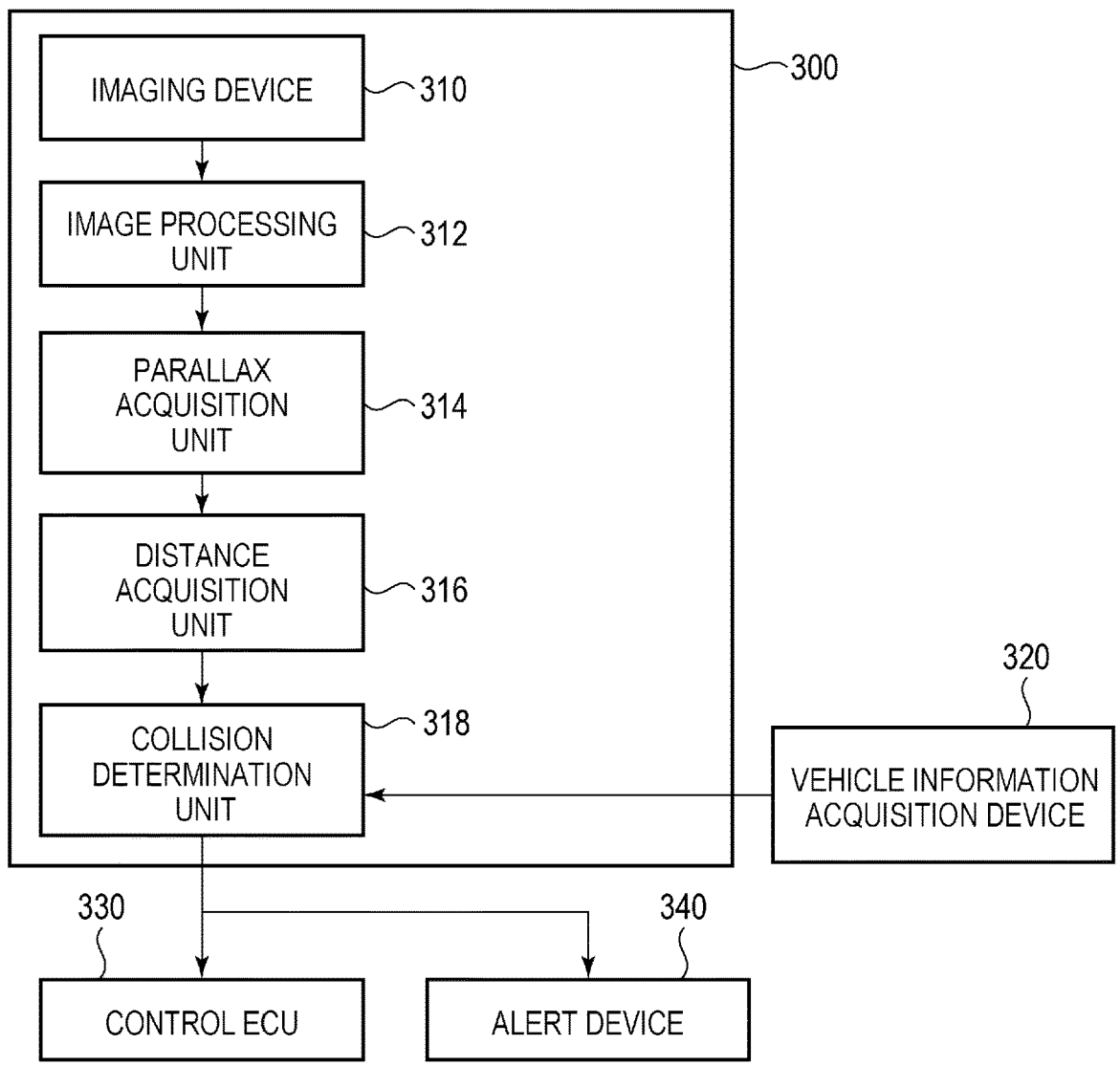
FIG. 16A is a diagram illustrating a configuration example of an imaging system according to a sixth embodiment of the present invention.
Figure 16B:
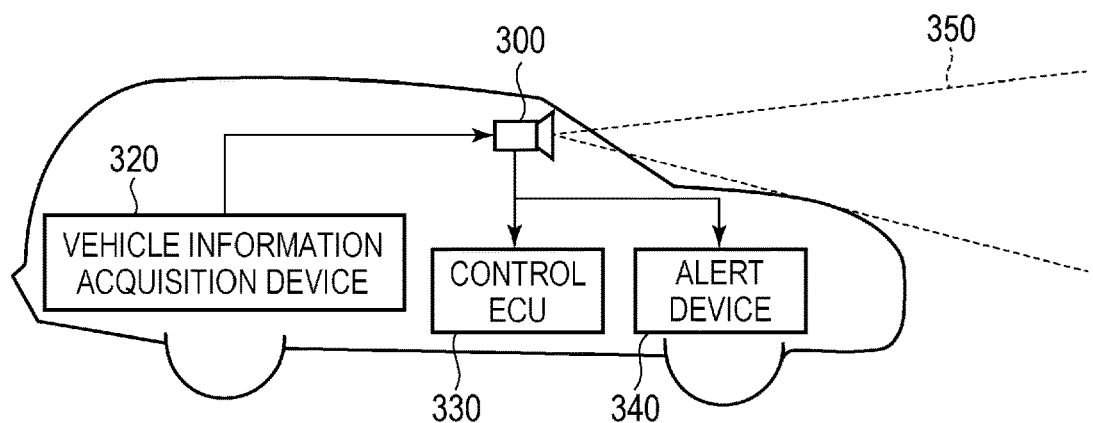
FIG. 16B is a diagram illustrating a configuration example of a movable object according to the sixth embodiment of the present invention.

An imaging system and a movable object according to a sixth embodiment of the present invention will be described by using FIG. 16A and FIG. 16B. FIG. 16A is a diagram illustrating a configuration of an imaging system according to the present embodiment. FIG. 16B is a diagram illustrating a configuration of a movable object according to the present embodiment.

FIG. 16A illustrates an example of an imaging system 300 related to an on-vehicle camera. The imaging system 300 has an imaging device 310. The imaging device 310 is any of the imaging devices 100 described in respective embodiments described above. The imaging system 300 has an image processing unit 312 that performs image processing on a plurality of image data acquired by the imaging device 310 and a parallax acquisition unit 314 that calculates a parallax (a phase difference of parallax images) from the plurality of image data acquired by the imaging device 310. Further, the imaging system 300 has a distance acquisition unit 316 that calculates a distance to the object based on the calculated parallax and a collision determination unit 318 that determines whether or not there is a collision possibility based on the calculated distance. Here, the parallax acquisition unit 314 and the distance acquisition unit 316 are an example of a distance information acquisition unit that acquires distance information on the distance to the object. That is, the distance information is information on a parallax, a defocus amount, a distance to an object, or the like. The collision determination unit 318 may use any of the distance information to determine the collision possibility. The distance information acquisition unit may be implemented by dedicatedly designed hardware or may be implemented by a software module. Further, the distance information acquisition unit may be implemented by a Field Programmable Gate Array (FPGA), an Application Specific Integrated Circuit (ASIC), or the like, or may be implemented by combination thereof.

The imaging system 300 is connected to the vehicle information acquisition device 320 and can acquire vehicle information such as a vehicle speed, a yaw rate, a steering angle, or the like. Further, the imaging system 300 is connected with a control ECU 330, which is a control device that outputs a control signal for causing a vehicle to generate braking force based on a determination result by the collision determination unit 318. That is, the control ECU 330 is an example of a movable object control unit that controls a movable object based on the distance information. Further, the imaging system 300 is connected with an alert device 340 that issues an alert to the driver based on a determination result by the collision determination unit 318. For example, when the collision probability is high as the determination result of the collision determination unit 318, the control ECU 330 performs vehicle control to avoid a collision or reduce damage by applying a brake, pushing back an accelerator, suppressing engine power, or the like. The alert device 340 alerts a user by sounding an alert such as a sound, displaying alert information on a display of a car navigation system or the like, providing vibration to a seat belt or a steering wheel, or the like.

In the present embodiment, an area around a vehicle, for example, a front area or a rear area is captured by using the imaging system 300. FIG. 16B illustrates the imaging system 300 in a case of capturing a front area of a vehicle (a capturing area 350). The vehicle information acquisition device 320 transmits instructions to operate the imaging system 300 to perform capturing an image. A use of the imaging device 100 of each of the embodiments described above allows the imaging system 300 of the present embodiment to further improve the ranging accuracy.

Although the example of control for avoiding a collision to another vehicle has been described, the embodiment is applicable to automatic driving control for following another vehicle, automatic driving control for not going out of a traffic lane, or the like. Furthermore, the imaging system is not limited to a vehicle such as the subject vehicle, and can be applied to a movable object (moving apparatus) such as a ship, an airplane, or an industrial robot, for example. In addition, the imaging system can be widely applied to a device which utilizes object recognition, such as an intelligent transportation system (ITS), without being limited to movable objects.

Modified Embodiment

The present invention is not limited to the above-described embodiments, and various modifications are possible.

For example, an example in which a part of the configuration of any of the embodiments is added to another embodiment or an example in which a part of the configuration of any of the embodiments is replaced with a part of the configuration of another embodiment is one of the embodiments of the present invention.

Further, while the imaging device in which signal charges are electrons (the charge accumulation region or the charge holding region is an n-type semiconductor region) has been described as an example in the above embodiment, the present invention can be applied to the imaging device in which signal charges are holes (the charge accumulation region or the charge holding region is a p-type semiconductor region). In this case, each semiconductor region described above is of the opposite conductivity type.

Further, while a well contact (the contact plug 172) is formed in a region in which the p-type semiconductor region 152 is provided in the first embodiment described above, the position where the well contact is arranged is not limited in particular, but may be arranged in another portion.

Further, the imaging systems illustrated in the fifth and sixth embodiments are examples of an imaging system to which the imaging device of the present invention may be applied, and an imaging system to which the imaging device of the present invention can be applied is not limited to the configuration illustrated in FIG. 15 and FIG. 16A.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2017-153929, filed Aug. 9, 2017 which is hereby incorporated by reference herein in its entirety.

What is claimed is:

1. An imaging device comprising:
    a first buried diode including a first semiconductor region of a first conductivity type provided in a surface part of a first region of a semiconductor substrate and a second semiconductor region of a second conductivity type provided inside the first region;
    a second buried diode including a third semiconductor region of the first conductivity type provided in a surface part of a second region of the semiconductor substrate and a fourth semiconductor region of the second conductivity type provided inside the second region;
    a fifth semiconductor region of the first conductivity type provided at the same depth as the first semiconductor region and the third semiconductor region of a third region between the first region and the second region; and
    a sixth semiconductor region of the first conductivity type provided at a different depth from the fifth semiconductor region of the third region and electrically connected to a contact electrode provided on the semiconductor substrate,
    wherein an impurity concentration of the fifth semiconductor region is higher than an impurity concentration of the first semiconductor region and an impurity concentration of the third semiconductor region.

2. The imaging device according to claim 1, wherein an impurity concentration of the sixth semiconductor region is higher than the impurity concentration of the fifth semiconductor region.

3. The imaging device according to claim 1, wherein the first buried diode forms a photoelectric conversion portion of a first pixel, and the second buried diode forms a photoelectric conversion portion of a second pixel neighboring to the first pixel.

4. The imaging device according to claim 1, wherein the first buried diode forms a photoelectric conversion portion of a first pixel, and the second buried diode forms a charge holding portion of a second pixel neighboring to the first pixel.

5. The imaging device according to claim 3 further comprising a sixth semiconductor region of the first conductivity type provided for isolating the first pixel and the second pixel from each other at a deeper part than the fifth semiconductor region of the third region.

6. The imaging device according to claim 4 further comprising a sixth semiconductor region of the first conductivity type provided for isolating the first pixel and the second pixel from each other at a deeper part than the fifth semiconductor region of the third region.

7. The imaging device according to claim 1 further comprising an eighth semiconductor region of the first conductivity type in a connection part between the fifth semiconductor region and the contact electrode.

8. The imaging device according to claim 1 further comprising an element isolation region that defines an active region including the first region, the second region, and the third region in the semiconductor substrate,
    wherein the fifth semiconductor region is electrically connected to a ninth semiconductor region of the first conductivity type arranged around the element isolation region.

9. The imaging device according to claim 1, wherein, in a plan view, the first semiconductor region is spaced apart from a gate electrode of a transistor including the second semiconductor region as a source region.

10. The imaging device according to claim 1, wherein the second semiconductor region is extended to a region under a gate electrode of a transistor including the second semiconductor region as a source region.

\* \* \* \* \*